(12) United States Patent
Kim et al.

(10) Patent No.: US 11,532,674 B2
(45) Date of Patent: Dec. 20, 2022

(54) DISPLAY DEVICE HAVING LOW REFRACTIVITY LAYER AND METHOD FOR MANUFACTURING THE SAME

(71) Applicant: Samsung Display Co., LTD., Yongin-si (KR)

(72) Inventors: Young Gu Kim, Yongin-si (KR); Ji Yun Park, Hwaseong-si (KR); Jong Ho Son, Seoul (KR); Jong Min Ok, Hwaseong-si (KR); Sun-Young Chang, Seoul (KR); Hye Lim Jang, Hwaseong-si (KR); Baek Kyun Jeon, Yongin-si (KR); Kyung Seon Tak, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 303 days.

(21) Appl. No.: 16/910,336

(22) Filed: Jun. 24, 2020

(65) Prior Publication Data
US 2021/0126056 A1 Apr. 29, 2021

(30) Foreign Application Priority Data
Oct. 29, 2019 (KR) .................. 10-2019-0135322

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3246* (2013.01); *H01L 27/3276* (2013.01);
(Continued)

(58) Field of Classification Search
CPC combination set(s) only.
See application file for complete search history.

(56) References Cited

U.S. PATENT DOCUMENTS 9,817,264 B2   11/2017   Li
10,048,412 B2   8/2018   Li
(Continued)

FOREIGN PATENT DOCUMENTS

| KR | 1020190047592 A | 5/2019 |
| KR | 1020190064254 A | 6/2019 |
| KR | 1020190088587 A | 7/2019 |

*Primary Examiner* — Nduka E Ojeh
(74) *Attorney, Agent, or Firm* — Cantor Colburn LLP

(57) ABSTRACT

A display device includes a display area including a first light-emitting area and a second light-emitting area; a peripheral area adjacent to the display area; pixels which emit incident light; an encapsulation layer covering the pixels; a first color-converting pattern corresponding to the first light-emitting area and having a refractivity; a transmission pattern corresponding to the second light-emitting area and through which the incident light is transmitted; a low refractivity layer is in the display area and facing the encapsulation layer with each of the first color-converting pattern and the transmission pattern therebetween, the low refractivity layer including: a resin and a hollow particle which define a refractivity lower than the refractivity of the first color-converting pattern; and a first dam structure in the peripheral area and spaced apart from the display area, the first dam structure and the transmission pattern being portions of a same material layer.

20 Claims, 16 Drawing Sheets

(52) U.S. Cl.
CPC ...... *H01L 51/5246* (2013.01); *H01L 51/5268* (2013.01); *H01L 51/5275* (2013.01); *H01L 51/5284* (2013.01); *H01L 51/56* (2013.01); *H01L 2227/323* (2013.01); *H01L 2251/5315* (2013.01); *H01L 2251/5369* (2013.01)

(56) References Cited

U.S. PATENT DOCUMENTS

| | | | |
|---|---|---|---|
| 2017/0053973 A1* | 2/2017 | Park | H01L 27/3246 |
| 2018/0366520 A1* | 12/2018 | Gwon | H01L 27/3246 |
| 2020/0295310 A1* | 9/2020 | Moon | H01L 27/322 |
| 2021/0175476 A1* | 6/2021 | Oh | H01L 27/322 |

* cited by examiner

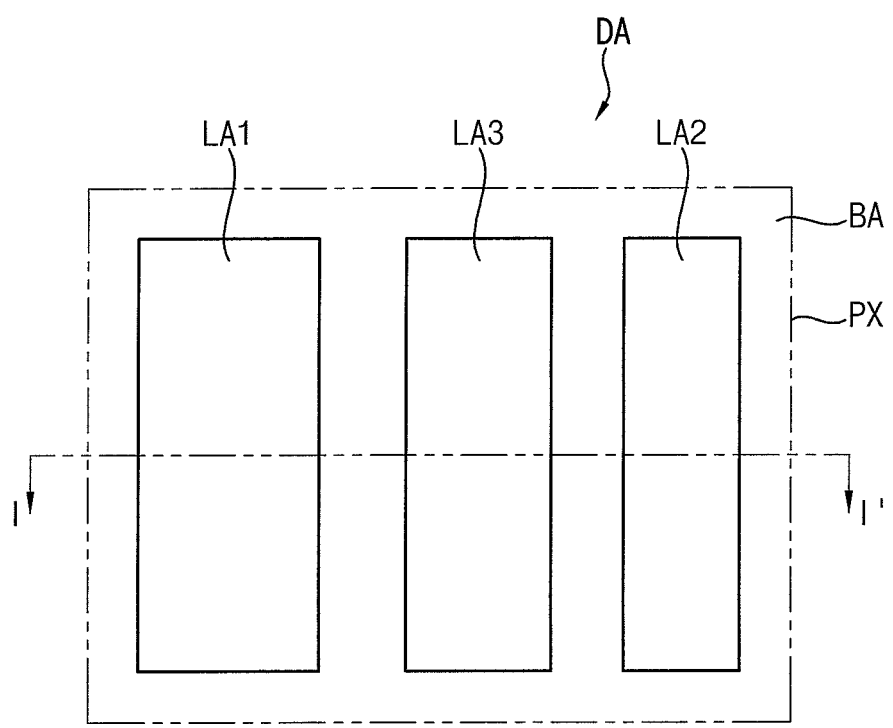
FIG. 2
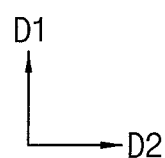

DISPLAY DEVICE HAVING LOW REFRACTIVITY LAYER AND METHOD FOR MANUFACTURING THE SAME

This application claims priority to Korean Patent Application No. 10-2019-0135322 filed on Oct. 29, 2019, and all the benefits accruing therefrom under 35 U.S.C. § 119, the entire disclosure of which is incorporated by reference herein in its entirety.

BACKGROUND

1. Field

Exemplary embodiments relate to a display device. More particularly, exemplary embodiments relate to a display device including a color-converting pattern and a method for manufacturing the display device.

2. Description of the Related Art

An organic light-emitting display device is a self-emissive display device, which is capable of generating a color image without an additional light source such as a backlight.

An organic light-emitting display device including a color filter and a color-converting pattern is being developed for improving a display quality. The color-converting pattern may change a wavelength of a light generated by a light-emitting element. Thus, the color-converting pattern may output a light having a color different from an incident light. For example, the color-converting pattern may include a wavelength-converting particle such as a quantum dot.

SUMMARY

Exemplary embodiments provide a display device including a color-converting pattern on an array substrate.

Exemplary embodiments provide a method for manufacturing the display device.

According to an exemplary embodiment, a display device includes a display area including a plurality of light-emitting areas from which lights having different colors are respectively emitted from the display device, the plurality of light-emitting areas including a first light-emitting area and a second light-emitting area; a peripheral area which is adjacent to the display area; a plurality of pixels which corresponds to the plurality of light-emitting areas and emits incident light; an encapsulation layer covering the plurality of pixels; a first color-converting pattern corresponding to the first light-emitting area and including a wavelength-converting particle which color-converts the incident light, the first color-converting pattern having a refractivity; a transmission pattern corresponding to the second light-emitting area and through which the incident light is transmitted; a low refractivity layer which is in the display area and faces the encapsulation layer with each of the first color-converting pattern and the transmission pattern therebetween, the low refractivity layer including: a first resin and a hollow particle which is in the first resin; and a refractivity defined by the first resin and the hollow particle, which is lower than the refractivity of the first color-converting pattern; and a first dam structure in the peripheral area and spaced apart from the display area, the first dam structure and the transmission pattern being portions of a same material layer.

In an exemplary embodiment, the display device may further include a connection pad disposed in the peripheral area, and a transfer wiring electrically connecting the connection pad to the pixels. A portion of the first dam structure may be disposed between the connection pad and the display area.

In an exemplary embodiment, the compensation pattern and the first dam structure may include a resin and a scattering particle dispersed in the resin.

In an exemplary embodiment, the display device may further include a second color-converting pattern disposed between the low refractivity layer and the encapsulation layer. The second color-converting pattern may overlap a third light-emitting area and includes a wavelength-converting particle.

In an exemplary embodiment, the display device may further include a first color filter pattern overlapping the first light-emitting area and disposed on the low refractivity layer, and a second color filter pattern overlapping the third light-emitting area and disposed on the low refractivity layer.

In an exemplary embodiment, the display device may further include a light-blocking member disposed on the low refractivity layer and having a shape surrounding the first to third light-emitting areas.

In an exemplary embodiment, the first light-emitting area may emit a red light, the second light-emitting area may emit a blue light, and the third light-emitting area may emit a green light.

In an exemplary embodiment, the display device may further include a second dam structure disposed between the first dam structure and the display area.

The second dam structure may have a shape surrounding the display area and being adjacent to an end of the encapsulation layer.

In an exemplary embodiment, the display device may further include a third dam structure disposed on the first dam structure. The third dam structure may have a shape surrounding the display area and may include a light-blocking material.

In an exemplary embodiment, the wavelength-converting particle may include a quantum dot.

According to an exemplary embodiment, a display device includes a display area including a plurality of light-emitting areas from which lights having different colors are respectively emitted from the display device, the plurality of light-emitting areas including a first light-emitting area and a second light-emitting area; a peripheral area which is adjacent to the display area; a plurality of pixels which is in the display area and emits incident light; a partition wall layer defining a plurality of openings in the display area, the plurality of openings including a first opening; a color-converting pattern in the first opening of the partition wall layer and including a wavelength-converting particle, the color-converting pattern having a refractivity; an encapsulation layer covering the plurality of pixels; a low refractivity layer which is in the display area and faces the encapsulation layer with each of the color-converting pattern and the partition wall layer therebetween, the low refractivity layer including: a resin and a hollow particle which is in the resin; and a refractivity defined by the resin and the hollow particle, which is lower than the refractivity of the color-converting pattern; and a first dam structure in the peripheral area and spaced apart from the display area, the first dam structure and the partition wall layer being respective portions of a same material layer.

In an exemplary embodiment, the partition wall layer and the first dam structure may include a light-blocking material.

In an exemplary embodiment, the display device may further include a color filter pattern disposed on the low refractivity layer.

In an exemplary embodiment, the display device may further include a compensation pattern disposed in a second opening of the partition wall layer and through which the incident light is transmitted.

According to an exemplary embodiment, a method for manufacturing a display device includes providing in a display area of the display device: a plurality of light-emitting areas from which lights having different colors are respectively emitted from the display device, the plurality of light-emitting areas including a first light-emitting area and a second light-emitting area; and a plurality of pixels which emits incident light and respectively corresponds to the plurality of light-emitting areas; providing an encapsulation layer covering the plurality of pixels and extending into a peripheral area of the display device which is adjacent to the display area; providing a color-converting pattern corresponding to the first light-emitting area and having a refractivity; providing from a first single layer of material in the display area and extended to the peripheral area: a transmission pattern corresponding to the second light-emitting area, and a first dam structure in the peripheral area and spaced apart from the display area; and providing a low refractivity layer facing the encapsulation layer with both the transmission pattern and the color-converting pattern therebetween, the low refractivity layer including: a resin and a hollow particle which is in the resin; and a refractivity defined by the resin and the hollow particle, which is lower than the refractivity of the color-converting pattern.

According to one or more of the exemplary embodiments, a low refractivity layer is provided on the color-converting pattern to increase a light-extracting efficiency, thereby compensating for a decrease of light-emitting efficiency due to a low temperature curing process in forming the color-converting pattern.

Furthermore, a dam structure is provided in a peripheral area. Thus, overflow of a low refractivity layer material to a pad part in the peripheral area may be reduced or effectively prevented.

BRIEF DESCRIPTION OF THE DRAWINGS

Features of one or more exemplary embodiments of the invention will be more clearly understood from the following detailed description taken in conjunction with the accompanying drawings.

FIG. 2 is an enlarged top plan view illustrating an exemplary embodiment of a pixel area of a display device.

DETAILED DESCRIPTION

Figure 1:
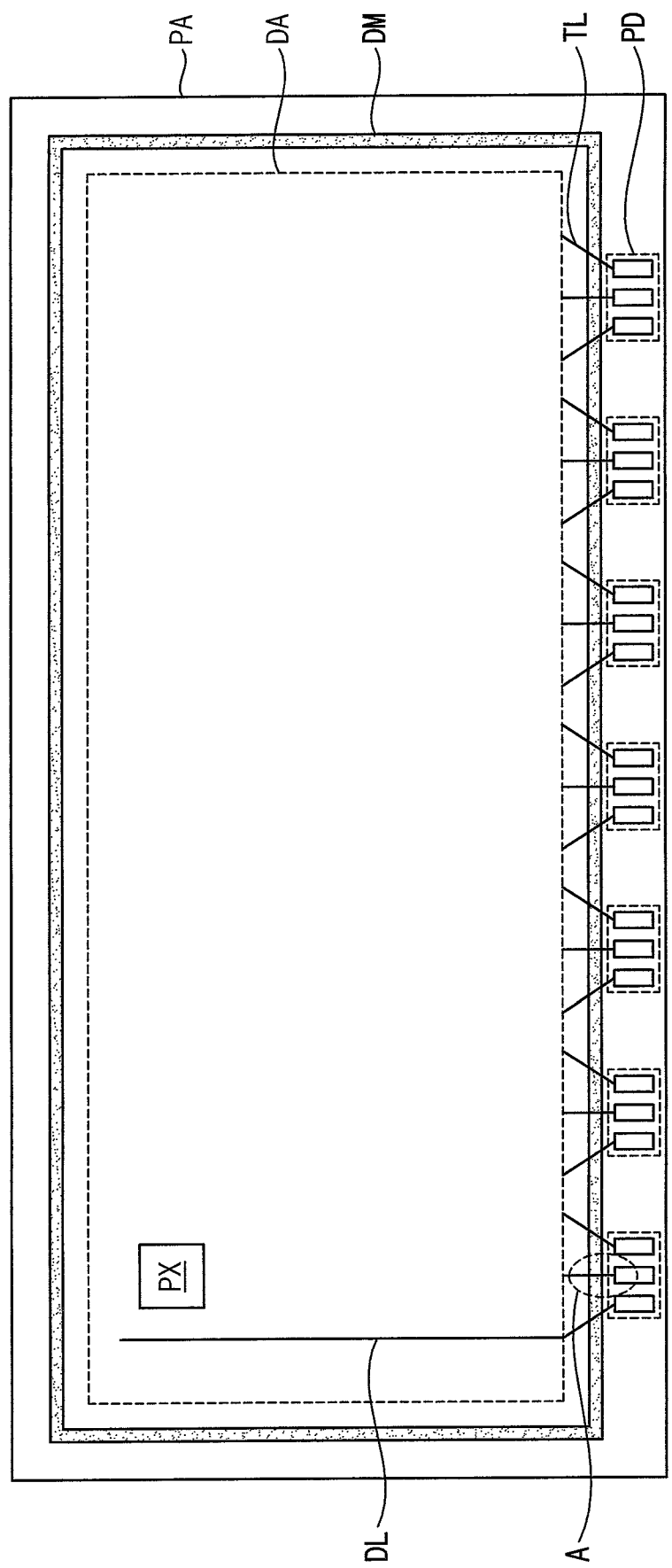
FIG. 1 is a top plan view illustrating an exemplary embodiment of a display device.

A display device and a method for manufacturing a display device according to exemplary embodiments of the invention will be described hereinafter with reference to the accompanying drawings, in which some exemplary embodiments are shown. Same or similar reference numerals may be used for same or similar elements in the drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper,"

depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Within a display device 10, an array substrate including an array of light-emitting elements may be combined with an opposing substrate including a color-converting pattern layer. A method for providing a color-converting pattern layer on an array substrate is being developed for reducing a thickness of the display device 10 and manufacturing costs thereof.

Figure 3:
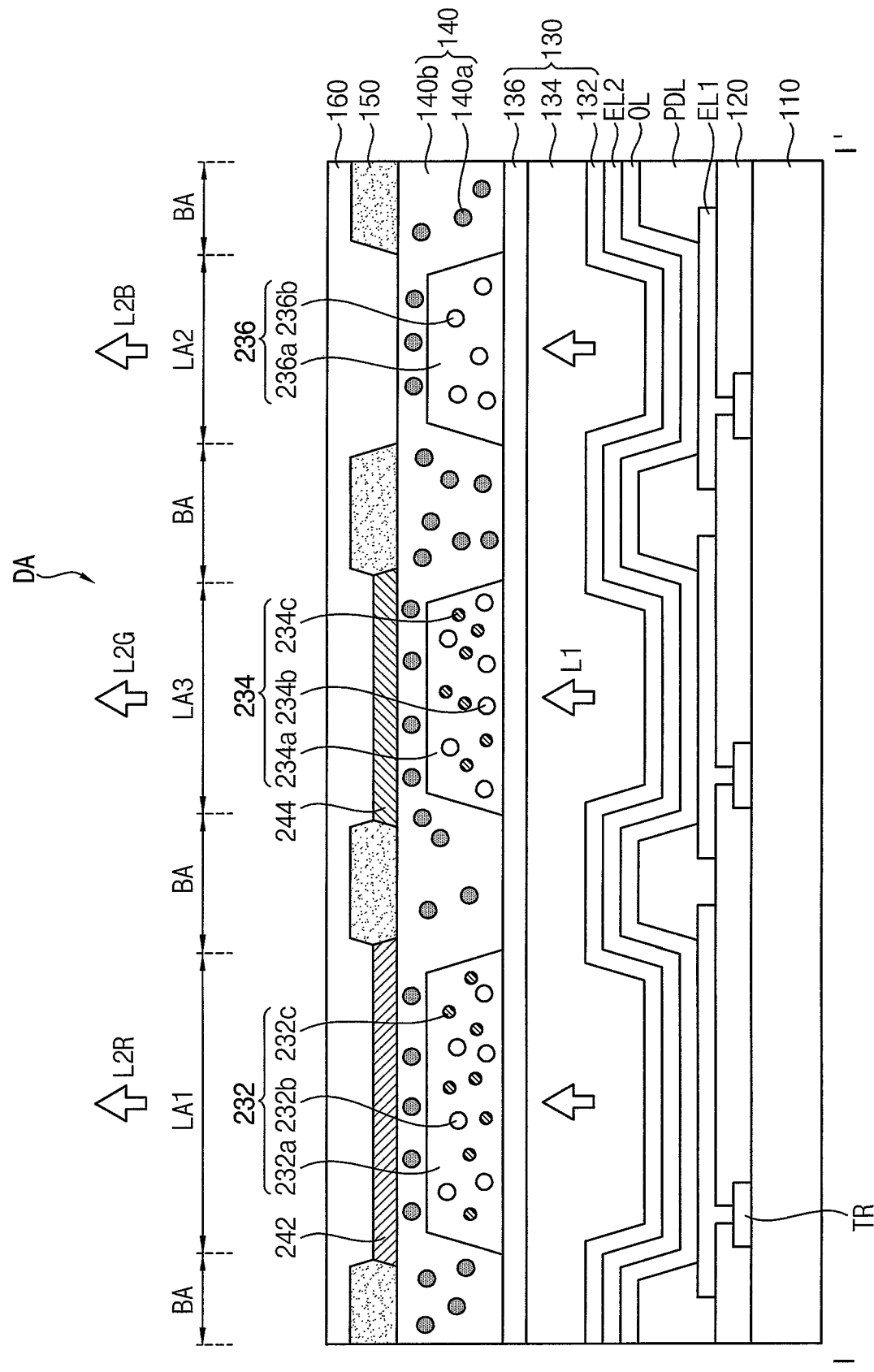
FIG. 3 is an enlarged cross-sectional view illustrating an exemplary embodiment of a pixel area of a display device.
Figure 4:
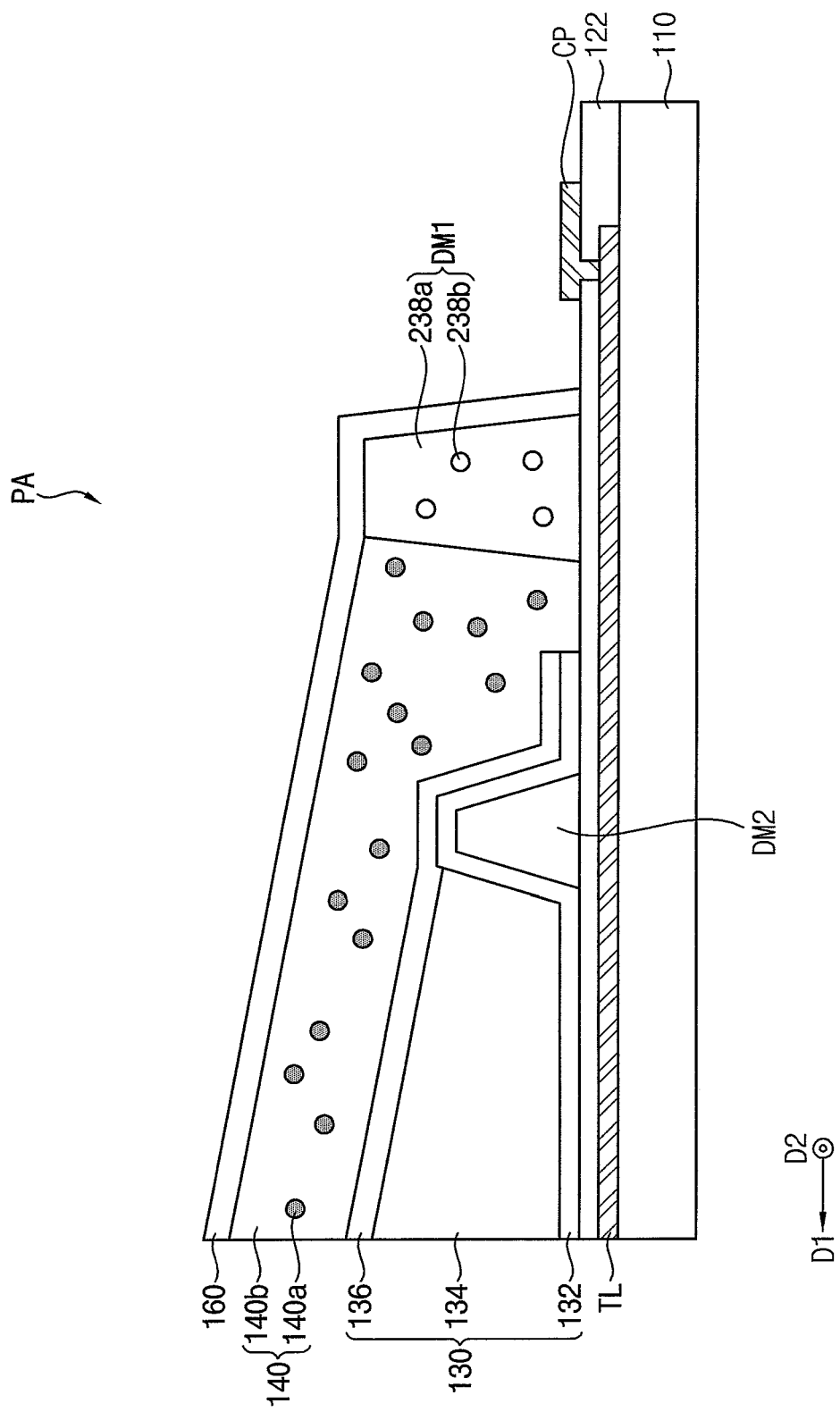
FIG. 4 is an enlarged cross-sectional view illustrating an exemplary embodiment of a peripheral area of a display device.

FIG. 1 is a top plan view illustrating an exemplary embodiment of a display device 10. FIG. 2 is an enlarged top plan view illustrating an exemplary embodiment of a pixel area PX of a display device 10. FIG. 3 is an enlarged cross-sectional view illustrating an exemplary embodiment of a pixel area PX of a display device 10. FIG. 4 is an enlarged cross-sectional view illustrating an exemplary embodiment of a peripheral area PA of a display device 10.

Referring to FIGS. 1 and 2, a display device 10 may include a display area DA at which an image is generated and/or displayed, a light is generated and/or emitted, etc., and a peripheral area PA which is adjacent to the display area DA such as surrounding the display area DA. In the display area DA, a pixel area PX (e.g., a pixel) may be provided in plurality (e.g., pixel areas or pixels). Each pixel area PX among the plurality of pixel areas may include a light-emitting area and a light-blocking area BA which is adjacent to the light-emitting area. In an exemplary embodiment, the light-blocking area BA may surround the light-emitting area.

A light generated by the display device 10 may exit to outside the display device 10 at or through the light-emitting area of the pixel area PX.

The display device 10 includes a pixel area PX provided in plurality (e.g., pixels) within the display area DA, to define an array of pixels (e.g., pixel array) disposed in the display area DA. The array of pixels may define a plurality of light-emitting areas in the display area DA. Each pixel area PX among the plurality of pixels may include a light-emitting element generating and/or emitting a light in response to a driving signal (e.g., an electrical signal) applied to the pixel area PX. That is, the plurality of pixels are in the display area DA and emit incident light in response to a driving signal (e.g., an electrical signal) applied to the pixels.

The display device 10 further includes a color-converting pattern, which changes a wavelength of a light generated by the light-emitting element. The display device 10 may further include a color filter, which transmits a specific color light.

The light-emitting areas may emit lights having different colors from each other. In an exemplary embodiment, for example, the display device 10 may include a first light-emitting area LA1 emitting a first color light, a second light-emitting area LA2 emitting a second color light and a third light-emitting area LA3 emitting a third color light. Different color lights may be generated at the light-emitting areas, without being limited thereto.

In an exemplary embodiment, light-emitting areas which emit lights having a same color may be arranged along a first direction D1, and light-emitting areas which emit lights having different colors may be arranged along a second direction D2 crossing the first direction D1. In an exemplary embodiment, for example, the first direction D1 may be a column direction, and the second direction D2 may be a row direction.

The display device 10 and components thereof may be disposed in a plane defined by the first direction D1 and the second direction D2. A thickness (e.g., thickness direction) of the display device 10 and components thereof may be defined along a third direction which crosses each of the first direction D1 and the second direction D2.

In an exemplary embodiment, the first light-emitting area LA1 may emit a red light, the second light-emitting area LA2 may emit a blue light, and the third light-emitting area LA3 may emit a green light. However, exemplary embodiments are not limited thereto. In an exemplary embodiment, for example, light-emitting areas may combine to emit a yellow light, a cyan light and a magenta light.

Furthermore, light-emitting areas may emit at least four color lights. In an exemplary embodiment, for example, light-emitting areas may be provided in the display area DA to emit at least one a yellow light, a cyan light and a magenta light in addition to a red light, a blue light and a green light. Furthermore, light-emitting areas may be provided to further emit a white light at the display area DA.

In an exemplary embodiment, the light-emitting areas may have a substantially rectangular shape as a planar shape, respectively. However, exemplary embodiments are not limited thereto. In an exemplary embodiment, for example, the light-emitting areas may have different planar shapes from each other. Furthermore, the light-emitting areas may have various planar shapes such as a square shape, a rhombus shape, a triangular shape, a circular shape or the like. An edge or a corner of each light-emitting area at a boundary thereof, may be rounded shape or may be chamfered, in a top plan view.

In an exemplary embodiment, the light-emitting areas may have different sizes (e.g., planar dimensions) from each other. Referring to FIG. 2, for example, the first light-emitting area LA1 emitting a red light may have a planar size which is larger than both a planar size of the second light-emitting area LA2 emitting a blue light and a planar size of the third light-emitting area LA3 emitting a green light. Furthermore, the third light-emitting area LA3 may have a planar size which is larger than a planar size the second light-emitting area LA2.

However, exemplary embodiments are not limited thereto. For example, the light-emitting areas may have a same planar size as each other within the display area DA.

A pad part PD (e.g., pad portion) and a transfer wiring TL may be provided or formed in the peripheral area PA. The pad part PD may include a connection pad CP (FIG. 4) provided in plurality (e.g., connection pads). The pad part PD may be provided in plurality to define a plurality of pad parts PD. In an exemplary embodiment, for example, a plurality of pad parts PD may be arranged along the second direction D2, in the peripheral area PA. The pad part PD may be electrically connected to an external driving device (not shown) such as a printed circuit board or a driving chip, so that one or more electrical signal such as a driving signal, a power, a power signal or the like may be transferred to the transfer wiring TL through the connection pads. That is, an electrical signal may be provided from outside the display device 10 (e.g., from an external driving device) to the display area DA, through the connection pads and the transfer wiring TL.

In an exemplary embodiment, the transfer wiring TL may be a fan-out wiring transferring an electrical signal such as a data signal to a data line DL disposed in the display area DA. However, exemplary embodiments are not limited thereto. In an exemplary embodiment, for example, the transfer wiring TL may include various wirings such as a control signal wiring, which transfers an electrical signal such as a control signal to a gate driver disposed in the peripheral area PA, a power transfer wiring, which transfers an electrical signal such as a power voltage to a light-emitting element disposed in the display area DA, or the like.

FIG. 3 is an enlarged cross-sectional view taken along line I-I' of FIG. 2, and FIG. 4 is an enlarged cross-sectional view illustrating region 'A' of FIG. 1.

Referring to FIG. 3, the display device 10 includes a driving element TR disposed on a base substrate 110, in the display area DA. The driving element TR may be electrically connected to a corresponding light-emitting element, and may control or drive the light-emitting element to generate light, emit light, generate an image, display an image, etc. The light-emitting element may be an organic light-emitting diode. In an exemplary embodiment, for example, the organic light-emitting diode may include a first electrode EL1, a second electrode EL2 and an organic light-emitting layer OL which is disposed between the first electrode EL1 and the second electrode EL2. One or more of the aforementioned elements of the light-emitting element may be provided in plural along the base substrate 110, without being limited thereto.

In an exemplary embodiment, for example, the base substrate 110 may include glass, quartz, sapphire, a polymeric material or the like.

In an exemplary embodiment, the driving element TR may include a thin film transistor. The driving element TR may include a plurality of thin film transistors.

In an exemplary embodiment, for example, a channel layer of the thin film transistor may include amorphous silicon, multi-crystalline silicon (polysilicon) or a metal oxide. In an exemplary embodiment, for example, the metal oxide may include two-component compound (ABx), ternary compound (ABxCy) or four-component compound (ABxCyDz), which includes indium (In), zinc (Zn), gallium (Ga), tin (Sn), titanium (Ti), aluminum (Al), hafnium (Hf), zirconium (Zr), magnesium (Mg). In an exemplary embodiment, for example, the metal oxide may include zinc oxide (ZnOx), gallium oxide (GaOx), titanium oxide (TiOx), tin oxide (SnOx), indium oxide (InOx), indium-gallium oxide ("IGO"), indium-zinc oxide ("IZO"), indium tin oxide ("ITO"), gallium zinc oxide ("GZO"), zinc magnesium oxide ("ZMO"), zinc tin oxide ("ZTO"), zinc zirconium oxide (ZnZrxOy), indium-gallium-zinc oxide ("IGZO"), indium-zinc-tin oxide ("IZTO"), indium-gallium-hafnium oxide ("IGHO"), tin-aluminum-zinc oxide ("TAZO"), indium-gallium-tin oxide ("IGTO") or the like.

The driving element TR may be covered by an insulation structure 120 (e.g., insulation layer). The insulation structure 120 may include a combination of an inorganic insulation layer and an organic insulation layer.

The first electrode EL1 may function as an anode. In an exemplary embodiment, for example, the first electrode EL1 may be provided or formed as a transmitting electrode or a reflecting electrode according to an emission type of the display device 10 (a front emission type or a rear emission type). When the first electrode EL1 is a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including a metal oxide layer including indium tin oxide, indium zinc oxide, zinc tin oxide, indium oxide, zinc oxide, tin oxide or the like.

A pixel-defining layer PDL is disposed on the insulation structure 120, and defines an opening overlapping or corresponding to at least a portion of the first electrode EL1. In an exemplary embodiment, for example, the pixel-defining layer PDL may include an organic insulating material. At least a portion of the organic light-emitting layer OL may be disposed in the opening of the pixel-defining layer PDL. In an exemplary embodiment, the organic light-emitting layer OL which is in the opening may extend to outside the opening and continuously over a plurality of pixels in the display area DA. In another exemplary embodiment, the organic light-emitting layer OL may be provided or formed as a pattern separated in a direction along the base substrate 110 from an organic light-emitting layer OL of an adjacent pixel area PX.

The organic light-emitting layer OL may include at least a light-emitting layer, and may further include at least one of a hole injection layer ("HIL"), a hole transporting layer ("HTL"), an electron transporting layer ("ETL") and an electron injection layer ("EIL"). In an exemplary embodiment, for example, the organic light-emitting layer OL may include a relatively low molecular weight organic compound or a relatively high molecular weight organic compound.

In an exemplary embodiment, the organic light-emitting layer OL may generate a blue light. However, exemplary embodiments are not limited thereto. In an exemplary embodiment, for example, the organic light-emitting layer OL may generate a red light, a green light or the like. In another exemplary embodiment, the organic light-emitting layer OL may generate lights having different colors in different pixels.

The second electrode EL2 may be provided or formed as a transmitting electrode or a reflecting electrode according to an emission type of the display device 10. In an exemplary embodiment, for example, the second electrode EL2 may include a metal, a metal alloy, a metal nitride, a metal fluoride, a conductive metal oxide or a combination thereof. In an exemplary embodiment, for example, the second electrode EL2 may be provide or formed as a common layer extending continuously over a plurality of pixel areas within the display area DA.

The display device 10 may further include an encapsulation layer 130 covering a plurality of pixels and the light-emitting elements corresponding thereto. The encapsulation layer 130 may extend to cover an entirety of the display area DA.

In an exemplary embodiment, for example, the encapsulation layer 130 may have a stacked structure of an inorganic thin film and an organic thin film. In an exemplary embodiment, for example, as illustrated in FIG. 3, the encapsulation layer 130 may include a first inorganic thin film 132 (e.g., first inorganic layer), an organic thin film 134 (e.g., organic layer) disposed on the first inorganic thin film 132, and a second inorganic thin film 136 (e.g., second inorganic layer) disposed on the organic thin film 134. However, exemplary embodiments are not limited thereto. In an exemplary embodiment, for example, the encapsulation layer 130 may have a structure including at least two organic thin films and at least three inorganic thin films.

In an exemplary embodiment, for example, the organic thin film 134 may include a cured resin such as polyacrylate or the like. In an exemplary embodiment, for example, the cured resin may be provided or formed from a cross-linking reaction of monomers. In an exemplary embodiment, for example, the first inorganic thin film 132 and the second inorganic thin film 136 may include an inorganic material such as silicon oxide, silicon nitride, silicon carbide, aluminum oxide, tantalum oxide, hafnium oxide, zirconium oxide, titanium oxide or the like.

The display device 10 includes a color-converting pattern. The color-converting pattern changes a wavelength of a light L1 having a first color and generated by the light-emitting element, and emits a light having a second color different from the first color of the incident light L1. The display device 10 further includes a color filter pattern overlapping or corresponding to the color-converting pattern.

In an exemplary embodiment, the color-converting pattern may be disposed on the encapsulation layer 130. The color filter pattern may be disposed on the color-converting pattern. The color filter pattern may filter a light passing therethrough to transmit a light having a specific color.

The color-converting pattern may overlap a corresponding light-emitting area. In an exemplary embodiment, for example, the display device 10 may include a first color-converting pattern 232 overlapping or corresponding to the first light-emitting area LA1.

The first color-converting pattern 232 may include a wavelength-converting particle 232c and a resin part 232a (e.g., first resin) as a matrix or base portion in which the wavelength-converting particle 232c is provided.

In an exemplary embodiment, for example, the wavelength-converting particle 232c may include a quantum dot. The quantum dot may be defined as a nano-crystalline semiconductor material. The quantum dot may absorb an incident light which is incident to the quantum dot, and emit a light having a wavelength different from the incident light. In an exemplary embodiment, for example, the quantum dot may have a diameter equal to or less than about 100 nanometers (nm). In an exemplary embodiment, the quantum dot may have a diameter of about 1 nanometer (nm) to about 20 nm.

In an exemplary embodiment, for example the quantum dot may include a II-VI group compound, a III-V group compound, a IV-VI group compound, a IV group element, a IV group compound or a combination thereof.

In an exemplary embodiment, for example, the II-VI group compound may include a binary compound selected from CdSe, CdTe, ZnS, ZnSe, ZnTe, ZnO, HgS, HgSe, HgTe, MgSe, MgS and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe and a combination thereof.

In an exemplary embodiment, for example, the III-V group compound may include a binary compound selected from GaN, GaP, GaAs, GaSb, AlN, AlP, AlAs, AlSb, InN, InP, InAs, InSb and a combination thereof, a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof, or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof.

In an exemplary embodiment, for example, the IV-VI group compound may include a binary compound selected from SnS, SnSe, SnTe, PbS, PbSe, PbTe and a combination thereof, a ternary compound selected from SnSeS, SnSeTe, SnSTe, PbSeS, PbSeTe, PbSTe, SnPbS, SnPbSe, SnPbTe and a combination thereof, or a quaternary compound selected from SnPbSSe, SnPbSeTe, SnPbSTe and a combination thereof.

In an exemplary embodiment, for example, the IV group element may include Si, Ge or a combination thereof. The IV group compound may include a binary compound selected from SiC, SiGe and a combination thereof.

In an exemplary embodiment, for example, the quantum dot may have a core-shell structure including a core and a shell which surrounds the core. In an exemplary embodiment, for example, the core and the shell may include different materials from each other.

In an exemplary embodiment, for example, the wavelength-converting particle 232c may be dispersed in the resin part 232a. In an exemplary embodiment, for example, the resin part 232a may include an epoxy resin, an acrylic resin, a phenolic resin, a melamine resin, a cardo resin, an imide resin or the like.

The first color-converting pattern 232 may further include a scattering particle 232b. The scattering particle 232b may scatter an incident light which is incident to the scattering particle 232b, without substantially changing a wavelength of the incident light.

The scattering particle 232b may include a metal oxide or an inorganic material. In an exemplary embodiment, for example, the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$) or the like. In an exemplary embodiment, for example, the organic material may include an acrylic resin, an urethane resin or the like.

The display device 10 may further include a second color-converting pattern 234 overlapping or corresponding to the third light-emitting area LA3. The second color-converting pattern 234 may include a wavelength-converting particle 234c, a resin part 234a and a scattering particle 234b.

The display device 10 may further include a compensation pattern 236 overlapping or corresponding to the second light-emitting area LA2. The compensation pattern 236 may include a resin part 236a. In an exemplary embodiment, for example, the resin part 236a may include a same material as the resin part 232a and the resin part 234a of the first color-converting pattern 232 and the second color-converting pattern 234 (e.g., color-converting patterns). The compensation pattern 236 may further include a scattering particle 236b. Furthermore, the compensation pattern 236 may further include a coloring agent such as a pigment, a dye or the like to substantially function as a blue color filter. The first color-converting pattern 232, the second color-converting pattern 234 and the compensation pattern 236 may together be referred to as a color-converting pattern layer.

The display device 10 may further include a low refractivity layer 140 covering the first color-converting pattern 232, the second color-converting pattern 234 and the compensation pattern 236. The low refractivity layer 140 has a refractivity which is lower than a refractivity of the first color-converting pattern 232, the second color-converting pattern 234 and the compensation pattern 236. The low refractivity layer 140 may increase a light-extracting efficiency, thereby increasing brightness and durability of the display device 10. In an exemplary embodiment, for example, the low refractivity layer 140 may have a refractivity equal to or less than about 1.3.

The low refractivity layer 140 may include a hollow particle 140a to define a desired refractivity. In an exemplary embodiment, the low refractivity layer 140 may include a hollow particle 140a dispersed in a resin part 140b (e.g., second resin). That is, each of the first color-converting pattern 232, the second color-converting pattern 234 and the compensation pattern 236 has a refractivity, and the resin part 140b and the hollow particle 140a together define the refractivity of the low refractivity layer 140 to be lower than the refractivity of each of the first color-converting pattern 232, the second color-converting pattern 234 and the compensation pattern 236.

The hollow particle 140a may include an inorganic material. In an exemplary embodiment, for example, the hollow particle 140a may include silica ($SiO_2$), magnesium fluoride ($MgF_2$), iron oxide ($Fe_3O_4$) or a combination thereof. In an exemplary embodiment, the hollow particle 140a may include silica.

The hollow particle 140a may include a shell including inorganic material and a hollow which is defined in the shell. In an exemplary embodiment, for example, a size (e.g., such as a diameter) of the hollow particle 140a may be about 10 nm to about 100 nm, and a thickness of the shell of the hollow particle 140a may be about 5 nm to about 20 nm. In an exemplary embodiment, a diameter of the hollow particle 140a may be about 60 nm to about 100 nm. The diameter may indicate a maximum dimension of the hollow particle 140a, while the thickness is defined a portion of such maximum dimension, without being limited thereto.

In an exemplary embodiment, for example, an amount of the hollow particle 140a may be about 10 weight percent (wt %) to about 90 wt % based on a total weight of the low refractivity layer 140 including the hollow particle 140a and the resin part 140b, such as within about 40 wt % to about 60 wt %. When an amount of the hollow particle 140a is excessively small, obtaining a desired refractivity of the low refractivity layer 140 may be difficult. When an amount of the hollow particle 140a is excessively large, a surface roughness of the low refractivity layer 140 may be increased, and adhesion of the low refractivity layer 140 may be reduced.

In an exemplary embodiment, for example, the resin part 140b of the low refractivity layer 140 may include an acrylic resin, a siloxane resin, an urethane resin, an imide resin or the like, which may be selected or combined with each other in view of a desired refractivity and/or a coating process.

In an exemplary embodiment, for example, a thickness of the low refractivity layer 140 may be about 1 micrometer (μm) to about 5 micrometers (μm). Even though not illustrated, a protective layer including an inorganic material such as silicon oxide, silicon nitride or the like may be disposed between the low refractivity layer 140 and the color-converting pattern layer.

A color filter layer may be disposed on the low refractivity layer 140. In an exemplary embodiment, the color filter layer may include a first color filter pattern 242 and a second color filter pattern 244 (e.g., color filter patterns). The color filter patterns overlap corresponding light-emitting areas, respectively.

In an exemplary embodiment, the first color filter pattern 242 overlaps or corresponds to the first light-emitting area LA1. In an exemplary embodiment, for example, the first color filter pattern 242 may selectively transmit a red light. The second color filter pattern 244 overlaps or corresponds to the third light-emitting area LA3. In an exemplary embodiment, for example, the second color filter pattern 244 may selectively transmit a green light.

In an exemplary embodiment, for example, a light-emitting diode corresponding to the first light-emitting area LA1 may generate the light L1 as a blue light (e.g., a blue light L1) having a peak wavelength in a range of about 440 nm to about 480 nm. The first color-converting pattern 232 changes a wavelength of (e.g., wavelength-converts or color-converts) a portion of the blue light L1 incident to the first color-converting pattern 232 to emit a red light. A remainder of the blue light L1, which is not color-converted by the first color-converting pattern 232, is blocked by the first color filter pattern 242 (e.g., light-blocking color filter pattern). Thus, the first light-emitting area LA1 may selectively emit a red light L2R. In an exemplary embodiment, for example, the red light L2R may have a peak wavelength in a range of about 610 nm to about 650 nm.

In an exemplary embodiment, for example, a light-emitting diode corresponding to the third light-emitting area LA3 may generate a blue light L1. The second color-converting pattern 234 changes a wavelength of a portion of the blue light L1 incident thereon to emit a green light. A remainder of the blue light L1, which is not color-converted by the second color-converting pattern 234, is blocked by the second color filter pattern 244. Thus, the third light-emitting area LA3 may selectively emit a green light L2G. In an exemplary embodiment, for example, the green light L2G may have a peak wavelength in a range of about 510 nm to about 550 nm.

The compensation pattern 236 may not include a wavelength-converting particle. Thus, the blue light L1 entering the compensation pattern 236 may pass through the compensation pattern 236 to be emitted from the color-converting pattern layer (or display device 10) to outside thereof, without substantially changing a wavelength and/or a color of the blue light L1. Thus, the second light-emitting area LA2 may emit a blue light L2B. The compensation pattern 236 may otherwise be referred to as a transmission pattern.

The display device 10 may further include a light-blocking member 150 (e.g., light-blocking pattern or light-blocking pattern layer). The light-blocking member 150 may have a grid shape or a matrix shape in a plan view. The grid shape or matrix shape may be defined by solid portions and openings defined by the solid portions. In an exemplary embodiment, the light-blocking member 150 may have a shape surrounding the first light-emitting area LA1, the second light-emitting area LA2 and the third light-emitting area LA3 in the plan view. The light-blocking member 150 may be adjacent to each of the first light-emitting area LA1, the second light-emitting area LA2 and the third light-emitting area LA3 in the plan view.

A light-blocking area BA may be defined by the light-blocking member 150. In an exemplary embodiment, for example, the light-blocking member 150 may include openings corresponding to the first light-emitting area LA1, the second light-emitting area LA2 and the third light-emitting area LA3. Solid portions of the light-blocking member 150 may correspond to the light-blocking area BA.

The light-blocking member 150 may include a light-blocking material such as a pigment, a dye, a carbon black or the like, and a polymeric resin in which the light-blocking material is provided. The solid portions of the light-blocking member 150 may include the light-blocking material.

The light-blocking member 150 may be disposed on the low refractivity layer 140. The light-blocking member 150 may face the encapsulation layer 130 with the low refractivity layer 140 therebetween. The light-blocking member 150 may partially cover the color filter patterns. However, exemplary embodiments are not limited thereto. In an exemplary embodiment of manufacturing a display device 10, a light-blocking member 150 in which are defined the openings corresponding to the first light-emitting area LA1, the second light-emitting area LA2 and the third light-emitting area LA3, may be provided or formed prior to color filter patterns, and the color filter patterns may be provided or formed in the openings of the light-blocking member 150.

The display device 10 may further include a capping layer 160 covering the light-blocking member 150 and the color filter patterns. In an exemplary embodiment, for example, the capping layer 160 may include an inorganic material, an organic material or a combination thereof. In an exemplary embodiment, for example, the capping layer 160 may include an inorganic material such silicon oxide, silicon nitride or the like.

Referring to FIG. 4 together with FIG. 1, a transfer wiring TL is disposed on the base substrate 110, in the peripheral area PA. An insulation structure 122 is provided or formed on the transfer wiring TL, at an end portion or outer edge of the base substrate 110. The end portion or outer edge of the base substrate 110 may define an end portion or outer edge of the display device 10, without being limited thereto. A connection pad CP is disposed on the insulation structure 122. The connection pad CP may pass through the insulation structure 122 to electrically contact the transfer wiring TL. The insulation structure 122 in the peripheral area PA may be provided or formed from at least one material layer among insulation layers of the insulation structure 120 (FIG. 1) in the display area DA. That is, the insulation structure 120 and the insulation structure 122 may be respective portions or patterns of a same material layer on the base substrate 110.

The transfer wiring TL and the connection pad CP include a conductive material. In an exemplary embodiment, for example, the transfer wiring TL and the connection pad CP in the peripheral area PA may include or be formed from at least one metal layer which provides or forms the driving element TR in the display area DA. In an exemplary embodiment, for example, the transfer wiring TL may include or be formed from a same material layer as a gate metal pattern including a gate electrode of a transistor such as the driving element TR. The connection pad CP may include or be formed from a same material layer as a source metal pattern including a source electrode or a drain electrode of a transistor such as the driving element TR. That is, the driving element TR (e.g., an electrode or terminal thereof), and the transfer wiring TL and the connection pad CP, may be respective portions or patterns of a same material layer on the base substrate 110. However, exemplary embodiments are not limited thereto, and the transfer wiring TL and the connection pad CP may have various configurations that are conventionally known.

A first dam structure DM1 and a second dam structure DM2 are provided or formed on the insulation structure 122. One of or both of the first dam structure DM1 and the second dam structure DM2 may together may form a dam DM (FIG. 1). One of or both of the first dam structure DM1 and the second dam structure DM2 may extend along the base substrate 110 to have a shape surrounding the display area DA in the top plan view, as illustrated in FIG. 1. The dam DM is spaced apart from the display area DA in the top plan view.

In an exemplary embodiment, a portion of the first dam structure DM1 may be disposed between the second dam structure DM2 and the connection pad CP, in the top plan view. The second dam structure DM2 and the first dam structure DM1 may be disposed in order from the display area DA.

In an exemplary embodiment of a method of manufacturing a display device 10, the second dam structure DM2 may reduce or effectively prevent flow of a material such as a liquid material from the display area DA into an area where the connection pad CP is disposed. In an exemplary embodiment of a process of providing or forming the organic thin film 134 of the encapsulation layer 130, the second dam structure DM2 may reduce or effectively prevent flow of an organic material from the display area DA into an area where the connection pad CP is disposed. Thus, the second dam structure DM2 may be adjacent to an end of the encapsulation layer 130. Such end of the encapsulation layer 130 is closest to an end portion or outer edge of the base substrate 110, among portions of the encapsulation layer 130. In an exemplary embodiment, the second dam structure DM2 may be provided at the end portion of the base substrate 110 (e.g., a plurality of second dam structures DM2) to decrease overflow of a material to the area where the connection pad CP is disposed. The plurality of second dam structures DM2 may be arranged along the base substrate 110, in a direction from the encapsulation layer 130 to the connection pad CP (e.g., horizontal in FIG. 4).

The second dam structure DM2 may include an organic material. In an exemplary embodiment, for example, the second dam structure DM2 may include or be formed from a same material layer as the pixel-defining layer PDL in the display area DA or a combination with another organic insulation layer. That is, the second dam structure DM2 and the pixel-defining layer PDL may be respective portions or patterns of a same material layer on the base substrate 110.

The first inorganic thin film 132 and the second inorganic thin film 136 in the display area DA (FIG. 3), may extend to the peripheral area PA and may further extend over the second dam structure DM2. Within the peripheral area, the first inorganic thin film 132 and the second inorganic thin film 136 may further extend from the second dam structure DM2 to the first dam structure DM1.

In an exemplary embodiment of a method of manufacturing a display device 10, the first dam structure DM1 may reduce or effectively prevent flow of a material such as a liquid material from the display area and into an area where the connection pad CP is disposed. In an exemplary embodiment of a process of forming the low refractivity layer 140, the first dam structure DM1 may reduce or effectively prevent flow of a low refractivity material from the display area DA into an area where the connection pad CP is disposed.

In an exemplary embodiment, for example, the first dam structure DM1 in the peripheral area PA may include be formed from a same material as the compensation pattern 236 in the display area DA. In an exemplary embodiment, for example, the first dam structure DM1 may include a resin part 238a including an organic material and a scattering particle 238b which is dispersed in the resin part 238a. That is, the first dam structure DM1 and the compensation pattern 236 may be respective portions or patterns of a same material layer on the base substrate 110.

A height of the dam DM may be defined along a thickness direction of the display device 10 (e.g., vertical in FIG. 4), while a width of the dam DM is defined in a direction along the base substrate 110 (e.g., the first direction, the second direction, etc.) In an exemplary embodiment, a height of the first dam structure DM1 may be about 1 μm to about 20 μm, and a width of the first dam structure DM1 may be 1 μm to about 20 μm. A distance along the base substrate 110, between the display area DA and the first dam structure DM1, may be about 0 mm to about 5 mm.

An end of the low refractivity layer 140 which is furthest from the display area DA, may be adjacent to the first dam structure DM1. That is, the end of the low refractivity layer 140 is closest to the first dam structure DM1. In an exemplary embodiment, for example, the low refractivity layer 140 may extend along the base substrate 110 to contact an inner side surface of the first dam structure DM1 which is closest to the display area DA. However, exemplary embodiments are not limited thereto. An end of the low refractivity layer 140 may be spaced apart from the inner side surface of the first dam structure DM1, and the space between the end of the low refractivity layer 140 may be spaced apart from the inner side surface of the first dam structure DM1 may be defined by adjusting an amount of the low refractivity material which is coated on the base substrate 110.

Figure 5:
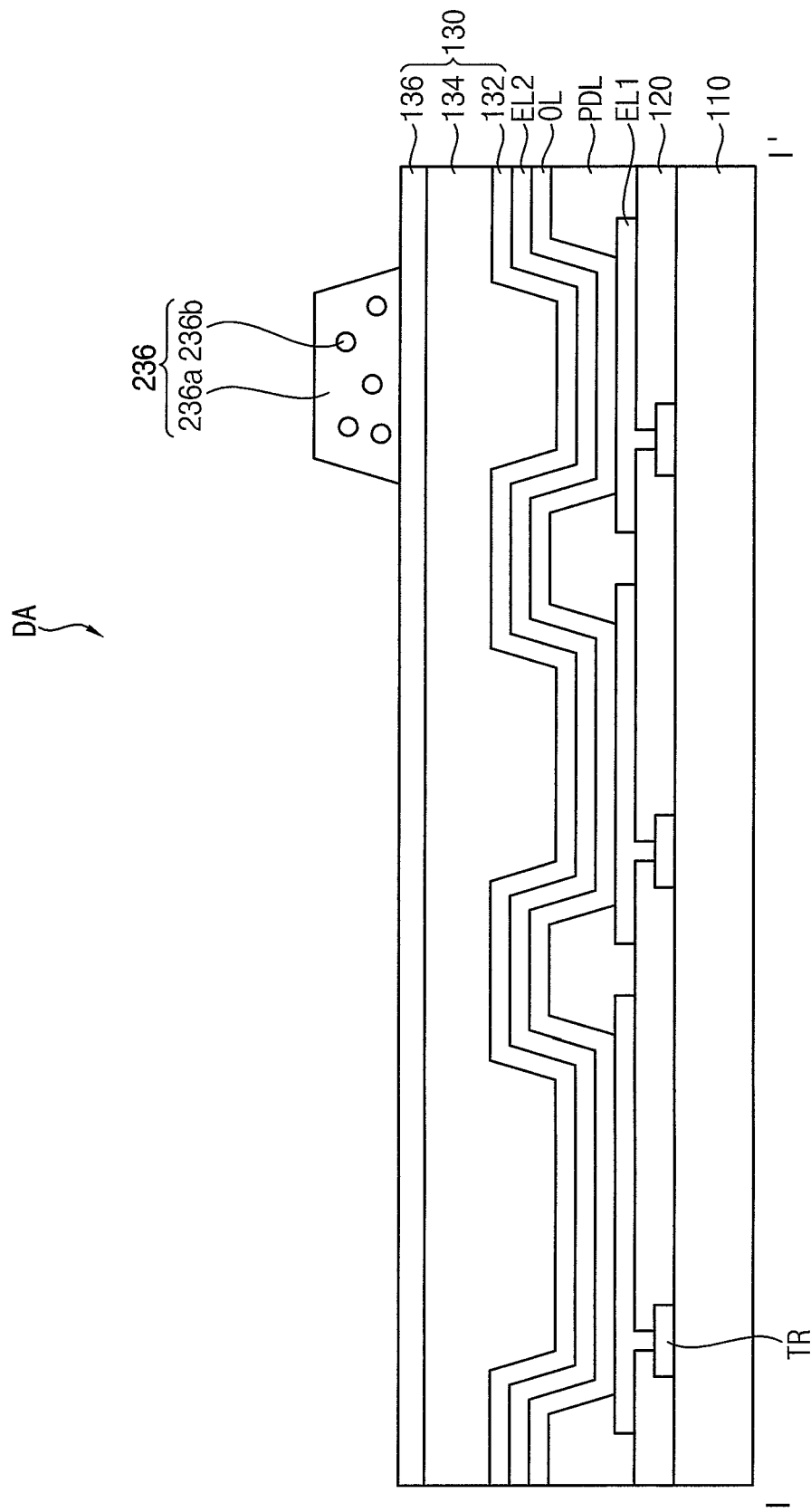
FIGS. 5 to 8 are enlarged cross-sectional views illustrating an exemplary embodiment of a method for manufacturing a display device.
Figure 6:
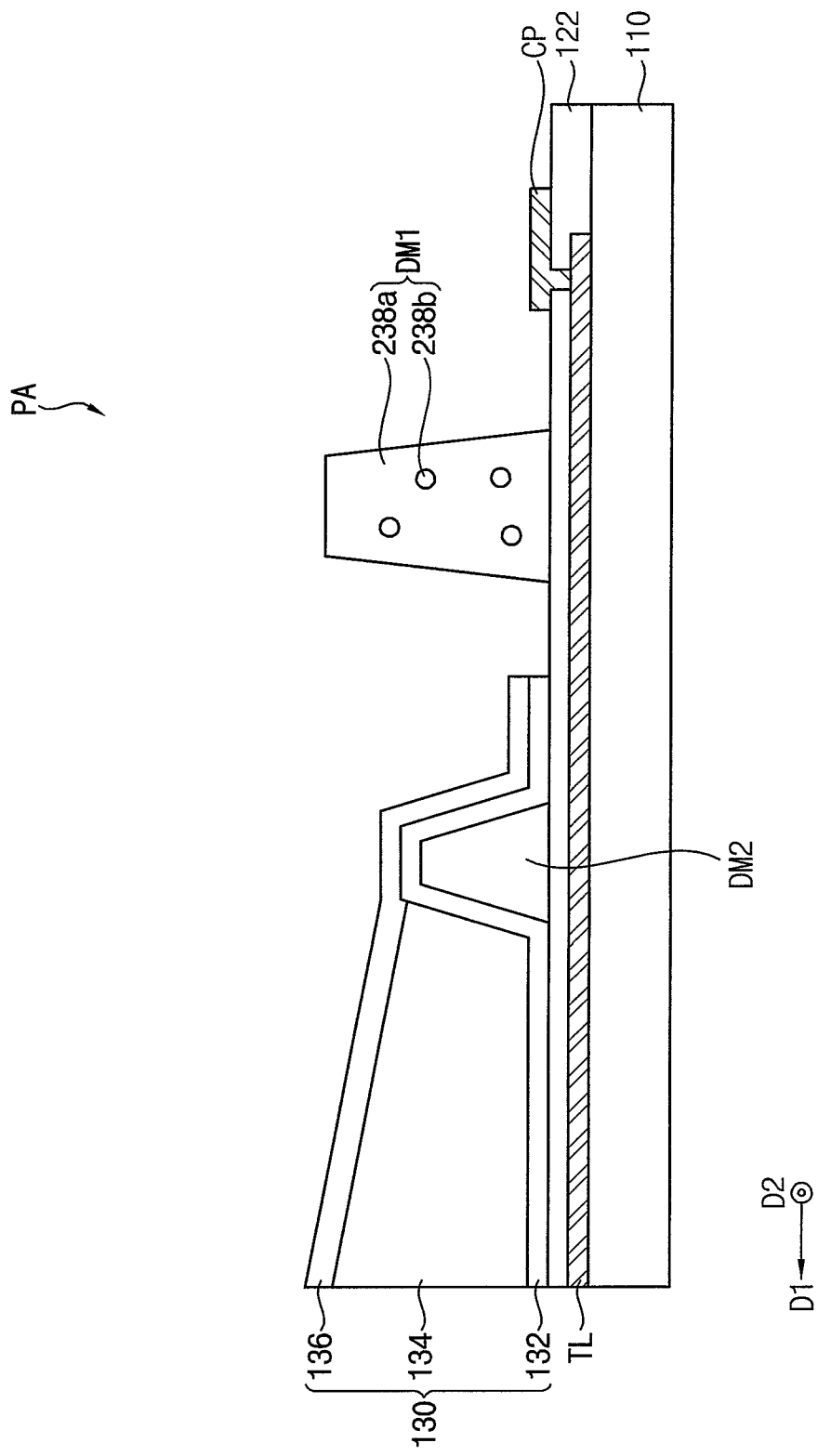
Figure 7:
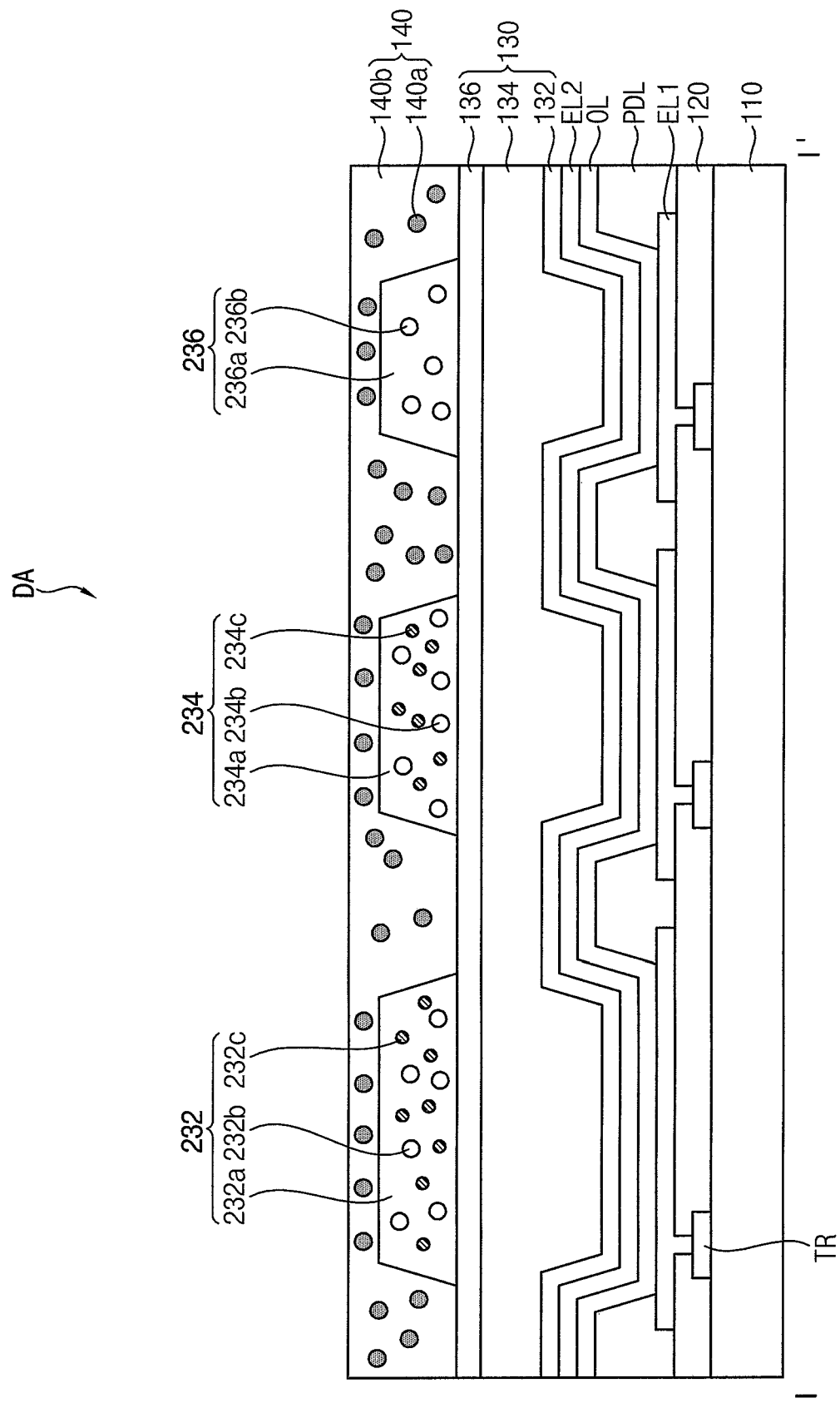
Figure 8:
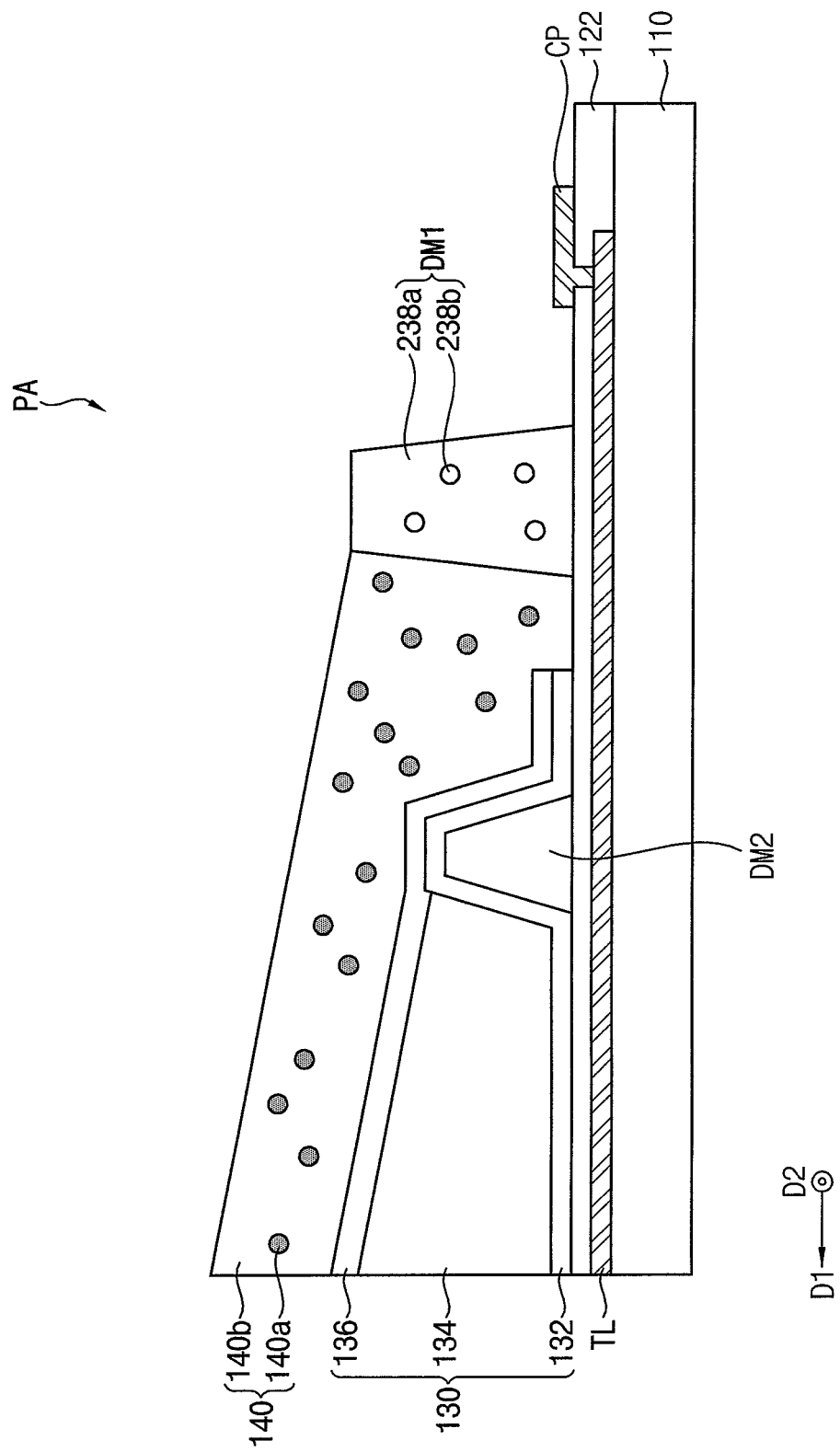

FIGS. 5 to 8 are enlarged cross-sectional views illustrating an exemplary embodiment of a method for manufacturing a display device 10. FIGS. 5 and 7 may illustrate a display area DA of a display device 10. FIGS. 6 and 8 may illustrate a peripheral area PA of the display device 10.

Referring to FIGS. 5 and 6, a compensation pattern 236 is provided or formed on an encapsulation layer 130 covering a light-emitting element in a display area DA. In an exemplary embodiment, for example, a base (or matrix) material including a scattering particle material therein and a binder material is coated on the encapsulation layer 130 and cured to provide or form the compensation pattern 236 including a resin part 236a and a scattering particle 236b.

The compensation pattern 236 may be provided or formed to overlap a corresponding light-emitting area. In an exemplary embodiment, for example, the base (or matrix) material including a scattering particle material therein may be provided on a portion of the encapsulation layer 130 such as through a screen printing method or the like. In another exemplary embodiment, the compensation pattern 236 may be provided or formed through a photolithography process.

A first dam structure DM1 may be provided or formed in a peripheral area PA in a same process in which the compensation pattern 236 is provided in the display area DA. The first dam structure DM1 may have a shape surrounding the display area DA in a top plan view. In a direction along the base substrate 110, a portion of the first dam structure DM1 may be disposed between a connection pad CP and a second dam structure DM2 for controlling an end position of an organic thin film 134 of the encapsulation layer 130 which is furthest from the display area DA.

The first dam structure DM1 may have a same material configuration as the compensation pattern 236. In an exemplary embodiment, for example, the base (or matrix) material including the scattering particle material therein and a binder material may be coated on portions of the encapsulation layer 130 in both the display area DA and the peripheral area PA. The coated material may then be cured to provide or form the compensation pattern 236 including a resin part 236a and a scattering particle 236b and the first dam structure DM1 including a resin part 238a including an organic material and a scattering particle 238b dispersed in the resin part 238a, at the same time and in the same process.

An exemplary embodiment of a method of manufacturing a display device 10 may include providing from a first single layer of material in the display area DA and extended to the peripheral area PA, a transmission pattern (e.g., the compensation pattern 236) corresponding to the second light-emitting area LA2, and the first dam structure DM1 in the peripheral area PA and spaced apart from the display area DA.

Referring to FIGS. 7 and 8, a first color-converting pattern 232 and a second color-converting pattern 234 are provided or formed on the encapsulation layer 130 in the display area DA.

The first color-converting pattern 232 and the second color-converting pattern 234 may be provided or formed by a similar method as the compensation pattern 236. In an exemplary embodiment, for example, a material including a corresponding wavelength-converting particle, a scattering particle material and a binder material may be coated and cured to form the first color-converting pattern 232 and the second color-converting pattern 234 in the display area DA.

In an exemplary embodiment, the first color-converting pattern 232 and the second color-converting pattern 234 may be provided or formed after the compensation pattern 236 is provided or formed. However, exemplary embodiments are not limited thereto. In an exemplary embodiment, for example, at least one of the first color-converting pattern 232 and the second color-converting pattern 234 may be provided or formed on the encapsulation layer 130 in the display area DA, before the compensation pattern 236 is provided or formed.

The material from which the first color-converting pattern 232, the second color-converting pattern 234 and the compensation pattern 236 are provided, may be curable at a relatively low temperature. In an exemplary embodiment, for example, the materials from which the first color-converting pattern 232 and the second color-converting pattern 234 and the compensation pattern 236 are provided may be curable at a temperature which is equal to or less than about 150 degrees Celsius (° C.), such as a temperature which is equal to or less than about 100° C. In an exemplary embodiment, for example, the binder material may include an acrylic resin, a siloxane resin, an urethane resin, an imide resin or the like. The binder material may further include a polymerizable monomer, a photo-polymerization initiator, a thermal-polymerization initiator, a solvent or the like.

Referring again to FIG. 7, a low refractivity layer 140 is provided or formed to cover the first color-converting pattern 232, the second color-converting pattern 234 and the compensation pattern 236.

In an exemplary embodiment, for example, a base (or matrix) material including a hollow particle material and a binder material may be coated on the first color-converting pattern 232, the second color-converting pattern 234 and the compensation pattern 236 and cured to provide or form the low refractivity layer 140 including the hollow particle 140a and a resin part 140b.

In an exemplary embodiment, for example, the base (or matrix) material including a hollow particle material and a binder material from which the low refractivity layer 140 is provided or formed, may be curable at a temperature which is equal to or less than about 150° C., such as a temperature equal to or less than 100 about ° C. In an exemplary embodiment, for example, the binder material may include siloxane having an epoxy group. The binder material may further include a salt of a sulfonium cation and a borate anion as a cationic initiator, and a corresponding solvent.

In an exemplary embodiment, for example, the base (or matrix) material including a hollow particle material and a binder material from which the low refractivity layer 140 may be provided on the display area DA such as through a slit coating method. The base (or matrix) material including a hollow particle material and a binder material from which the low refractivity layer 140 may be fluidic. Thus, the base (or matrix) material including a hollow particle material and a binder material from which the low refractivity layer 140 may flow into the peripheral area PA from the display area DA. Within the peripheral area PA, the first dam structure DM1 may reduce or effectively prevent overflow of the base (or matrix) material including a hollow particle material and a binder material from which the low refractivity layer 140 into an area where the connection pad CP is disposed.

The first color filter pattern 242 and the second color filter pattern 244, a light-blocking member 150 and a capping layer 160 are provided or formed on the low refractivity layer 140 as illustrated in FIG. 3.

When a color-converting pattern layer is included in an array substrate of a display device 10, a relatively low temperature curing process may be required for protecting a light-emitting element. The relatively low temperature curing process may decrease a light-emitting efficiency of a quantum dot in the color-converting pattern layer.

According to exemplary embodiments, a low refractivity layer 140 is provided on the color-converting pattern layer to increase a light-extracting efficiency, thereby compensating for decrease of light-emitting efficiency due to the relatively low temperature curing process.

Furthermore, a dam DM is provided in a peripheral area PA. Thus, overflow of a fluidic material applied in providing the low refractivity layer 140 in the display area DA and into a pad part PD of a peripheral area PA may be reduced or effectively prevented by the dam DM.

Furthermore, a display device 10 may have an integral structure including a light-emitting element and a color-converting pattern layer, which are provided or formed on a single one of the base substrate 110. Thus, the display device 10 may be used for a display device 10 which is flexible and/or rollable.

Figure 9:
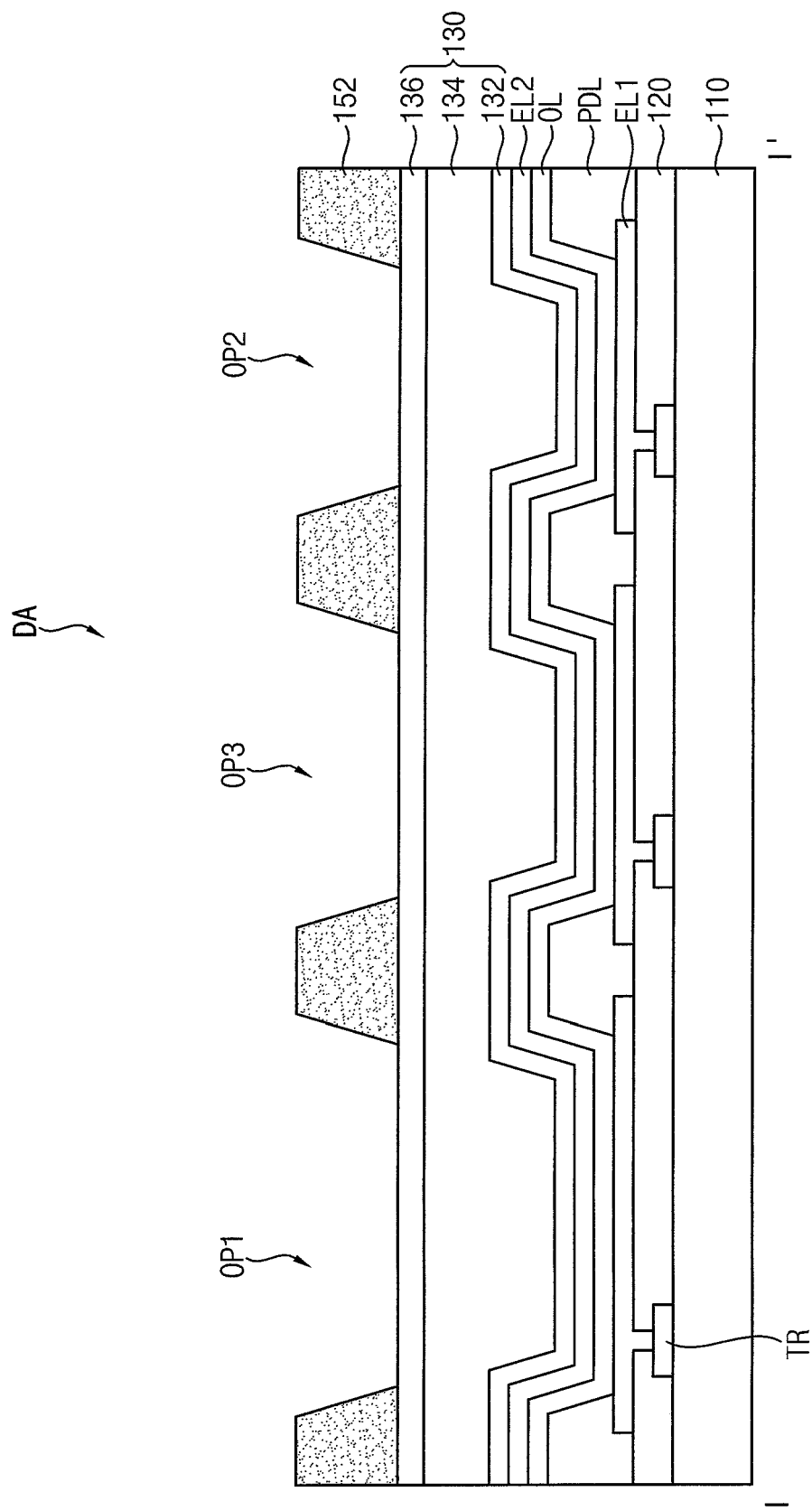
FIGS. 9 to 14 are enlarged cross-sectional views illustrating an exemplary embodiment of a method for manufacturing a display device.
Figure 10:
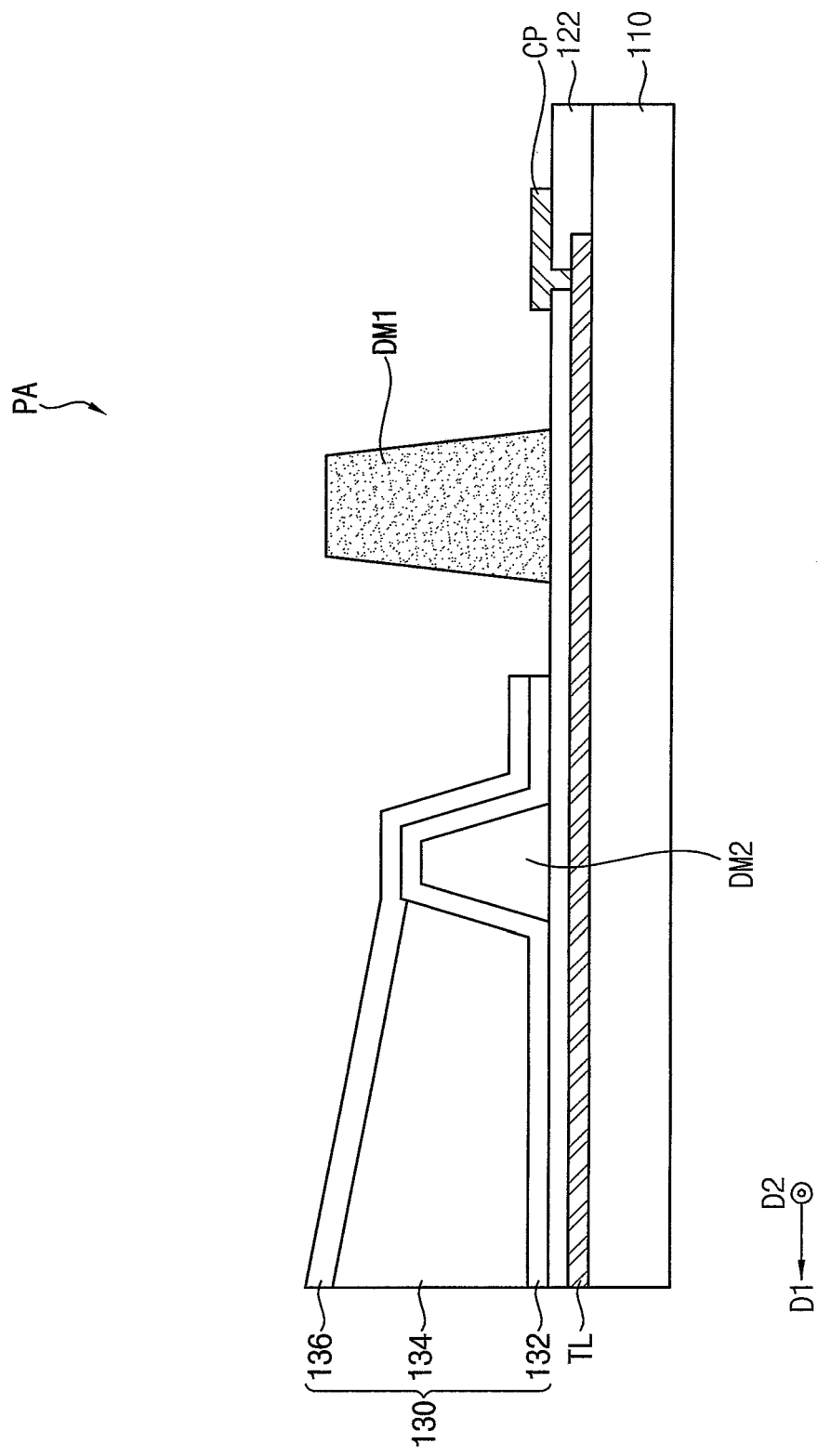
Figure 11:
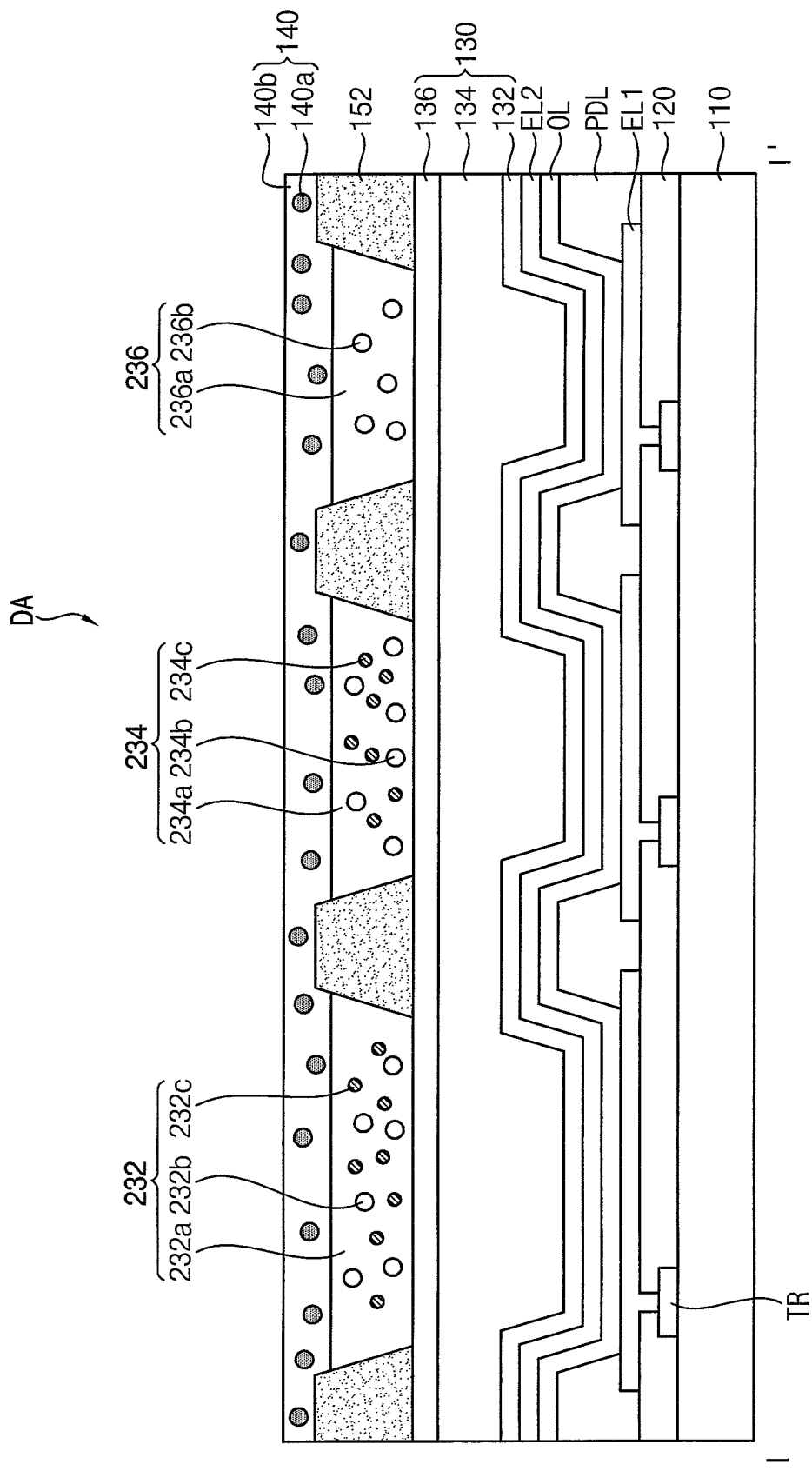
Figure 12:
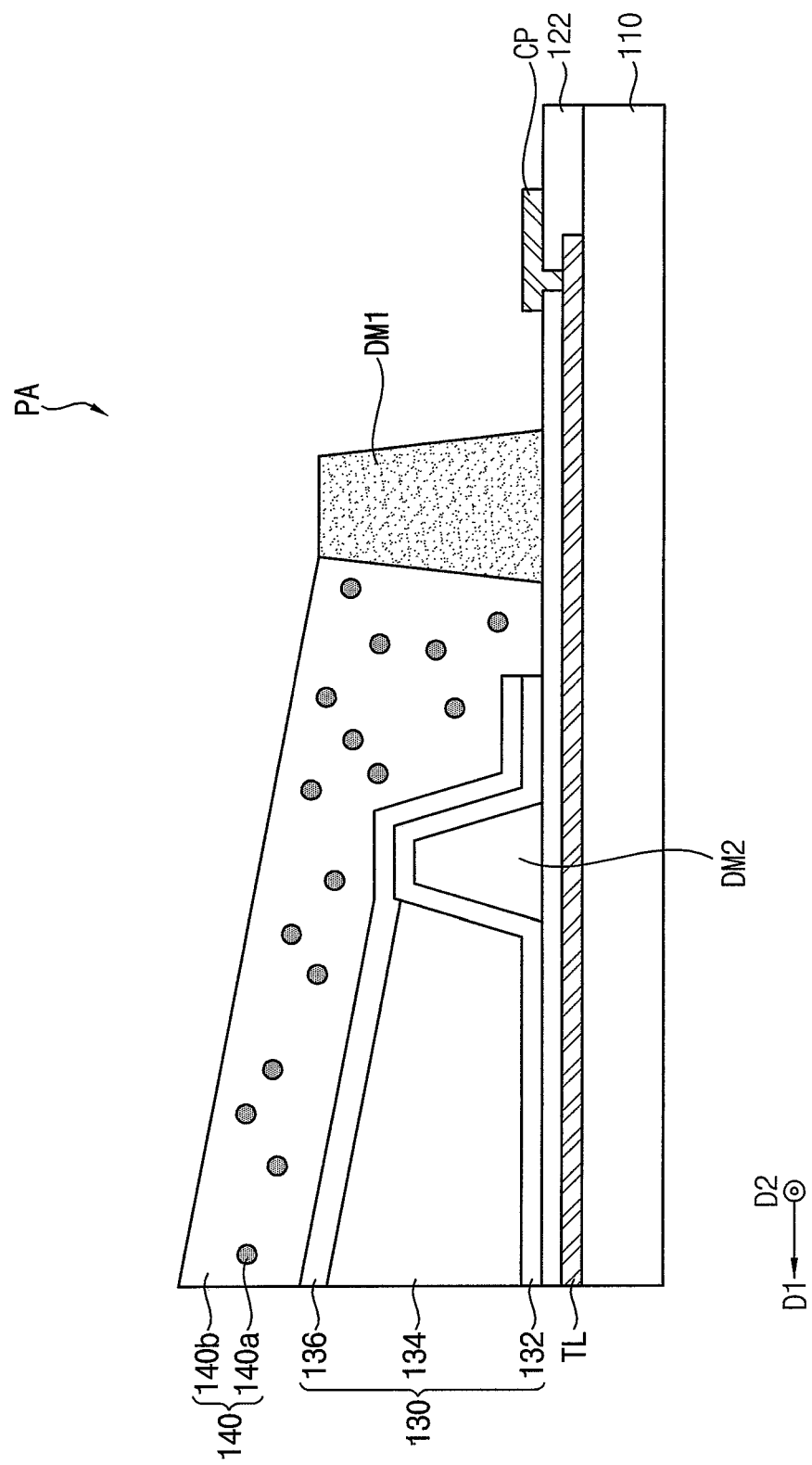
Figure 13:
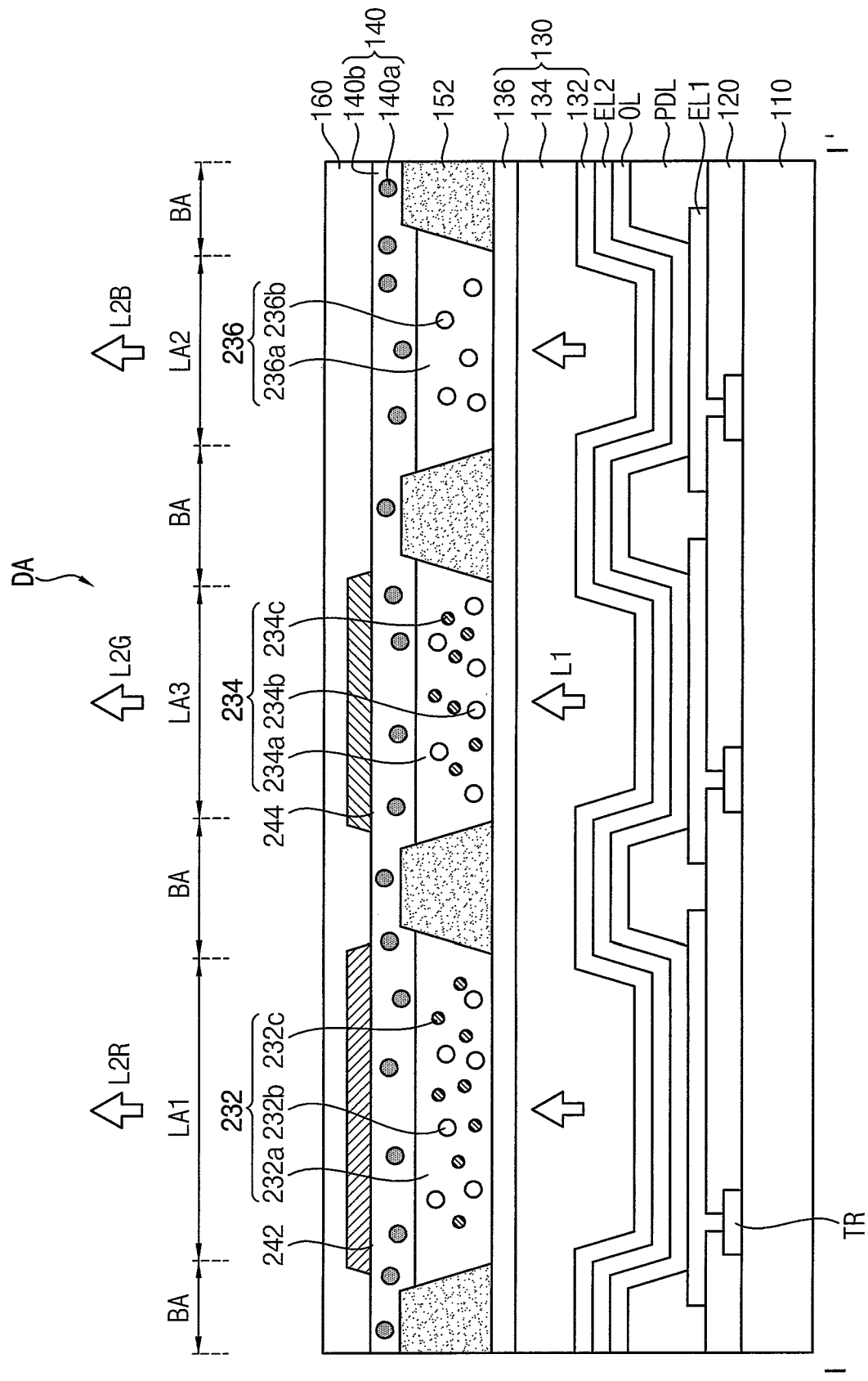
Figure 14:
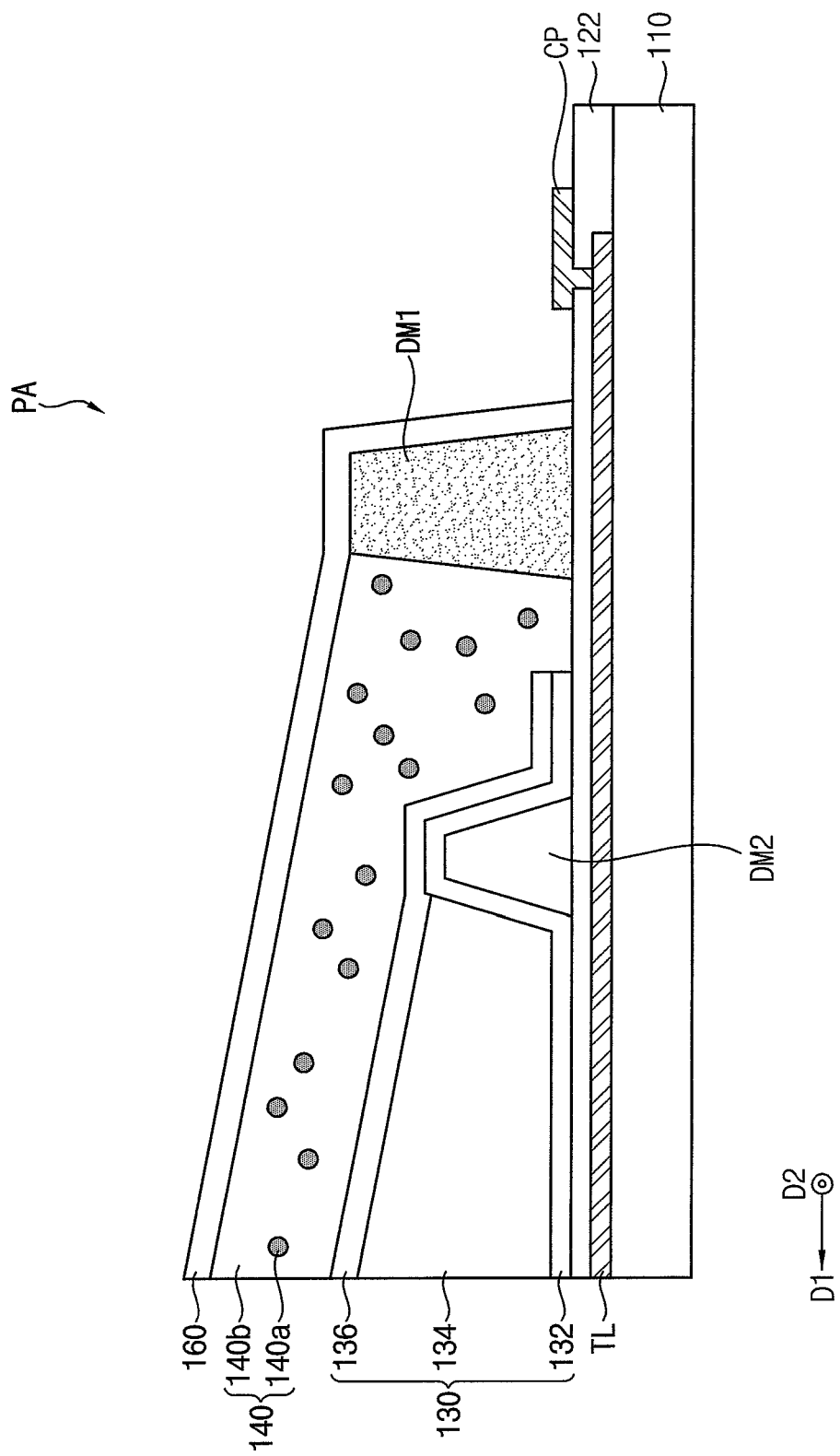

FIGS. 9 to 14 are enlarged cross-sectional views illustrating an exemplary embodiment of a method for manufacturing a display device 10. FIGS. 9, 11 and 13 may illustrate a display area DA of a display device 10. FIGS. 10, 12 and 14 may illustrate a peripheral area PA of the display device 10.

Referring to FIGS. 9 and 10, a partition wall 152 (e.g., partition wall layer) is provided or formed on an encapsulation layer 130 covering a light-emitting element.

In an exemplary embodiment, for example, the partition wall 152 may be provided or formed corresponding to a light-blocking area BA. Thus, the partition wall 152 may define or include openings respectively corresponding to light-emitting areas. In an exemplary embodiment, for example, the partition wall 152 may include a first opening OP1 corresponding to a first light-emitting area LA1, a second opening OP2 corresponding to a second light-emitting area LA2 and a third opening OP3 corresponding to a third light-emitting area LA3.

In an exemplary embodiment, the partition wall 152 may include a light-blocking material to function as a black matrix. A solid portion of the partition wall 152 may include the light-blocking material and the solid portion may define the openings. In an exemplary embodiment, for example, at least a portion of the partition wall 152 may include a light-blocking material such as a pigment, a dye, a carbon black or the like. In an exemplary embodiment, for example, the partition wall 152 may be provided or formed from a conventional black matrix material, such as through a screen printing method, a photolithography process or the like.

At the same time the partition wall 152 is provided or formed, a first dam structure DM1 may be provided or formed in a peripheral area PA, in a same process. The first dam structure DM1 may have a shape in a plan view, which surrounds the display area DA. A portion of the first dam structure DM1 may be disposed between a connection pad CP and a second dam structure DM2 for controlling an end position of an organic thin film 134 of the encapsulation layer 130.

The first dam structure DM1 may include a same material configuration as the partition wall 152. In an exemplary embodiment, for example, the first dam structure DM1 may include a binder resin and a light-blocking material. That is, the first dam structure DM1 and the partition wall 152 may be respective portions or patterns of a same material layer on the base substrate 110.

Referring to FIG. 11, the first color-converting pattern 232, the second color-converting pattern 234 and a compensation pattern 236 are provided or formed, such as through an inkjet printing method.

In an exemplary embodiment, for example, an inkjet printing apparatus may be used for provided or forming the first color-converting pattern 232, the second color-converting pattern 234 and 234 and the compensation pattern 236. The inkjet printing apparatus may include a head including a plurality of nozzles, without being limited thereto.

The inkjet printing apparatus may provide a color-conversion layer material in the first opening OP1, the second opening OP2 and the third opening OP3 of the partition wall 152, through the head and the nozzles. In an exemplary embodiment, for example, the inkjet printing apparatus may provide a first color-conversion layer material in the first opening OP1, may provide a second color-conversion layer material in the second opening OP2, and may provide a third color-conversion layer material in the third opening OP3.

In an exemplary embodiment, the first and third color-conversion layer materials may include a wavelength-converting particle material. In an exemplary embodiment, for example, the first and third color-conversion layer materials may include a wavelength-converting particle material, a binder material and a solvent.

In an exemplary embodiment, for example, the wavelength-converting particle material may include a quantum dot. In an exemplary embodiment, the first color-conversion layer material may include a quantum dot with which a red light is generated and emitted, and the third color-conversion layer material may include a quantum dot with which a green light is generated and emitted. The quantum dots may include an organic ligand combined with a surface thereof.

The binder material may include a polymer, a polymerizable monomer or a combination thereof. In an exemplary embodiment, for example, the polymer may include an aromatic ring structure in a main chain thereof. In an exemplary embodiment, for example, the aromatic ring structure may include a phenylene group, a biphenylene group, a fluorene or the like. The polymerizable monomer may include at least one double bond between carbon atoms. In an exemplary embodiment, for example, the polymerizable monomer may include a (meth)acrylate material.

The solvent may be selected or combined from materials in view of compatability with other material, dispersion of a quantum dot, a viscosity, a boiling point or the like.

The first and third color-conversion layer materials may further include a scattering particle material, a photo-initiator material, a polymer stabilizer material, a leveling agent material, a coupling agent material or a combination thereof, as desired.

The second color-conversion layer material may include a same material as the first and third color-conversion layer material except for excluding the wavelength-converting particle. In an exemplary embodiment, for example, the second color-conversion layer material may include a binder material and a solvent, and may further include a scattering particle material, a photo-initiator material, a polymer stabilizer material, a leveling agent material, a coupling agent material or a combination thereof, as desired.

The inkjet printing apparatus provides drops including a corresponding color-conversion layer material in the first opening OP1, the second opening OP2 and the third opening OP3. Thus, the first opening OP1, the second opening OP2 and the third opening OP3 may be filled with the corresponding color-conversion layer material.

The color-conversion layer materials provided in the first opening OP1, the second opening OP2 and the third opening OP3 may be cured to form a first color-converting pattern 232, a second color-converting pattern 234 and a compensation pattern 236. In an exemplary embodiment, for example, the color-conversion layer materials may be cured by heat and light.

A low refractivity layer 140 is provided or formed to cover the first color-converting pattern 232, the second color-converting pattern 234 and the compensation pattern 236. The low refractivity layer 140 may be provided or formed through the previously explained process.

The first dam structure DM1 may reduce or effectively prevent overflow of a fluidic material applied in providing the low refractivity layer 140 in the display area DA, into an area where the connection pad CP is disposed.

Referring to FIGS. 13 and 14, a first color filter pattern 242, a second color filter pattern 244 color filter patterns 242 and 244 and a capping layer 160 are provided or formed on the low refractivity layer 140. In an exemplary embodiment, for example, the capping layer 160 in the display area DA may extend from the display area DA and into the peripheral area PA.

Figure 15:
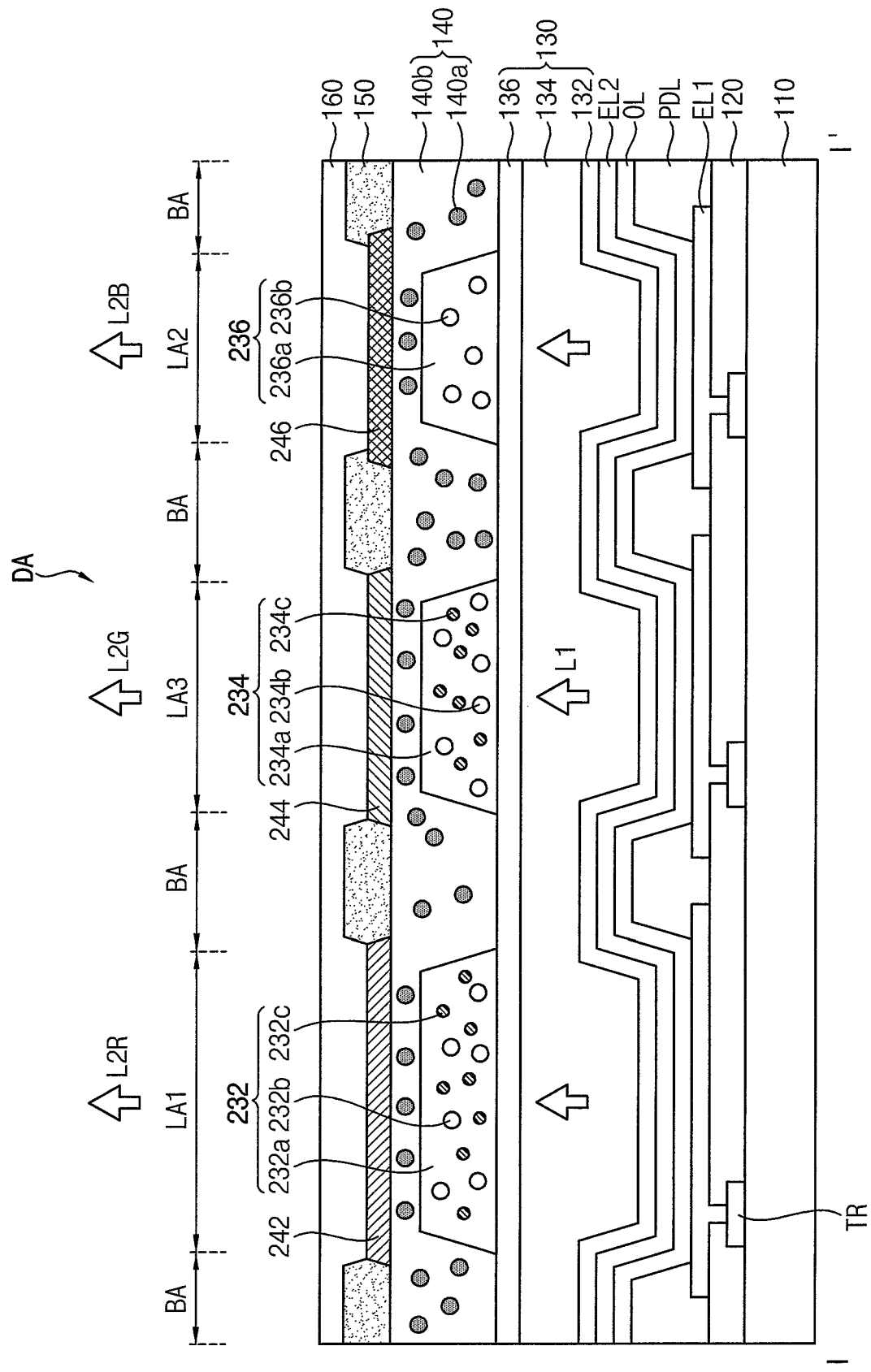
FIG. 15 is an enlarged cross-sectional view illustrating an exemplary embodiment of a pixel area of a display device.
Figure 16:
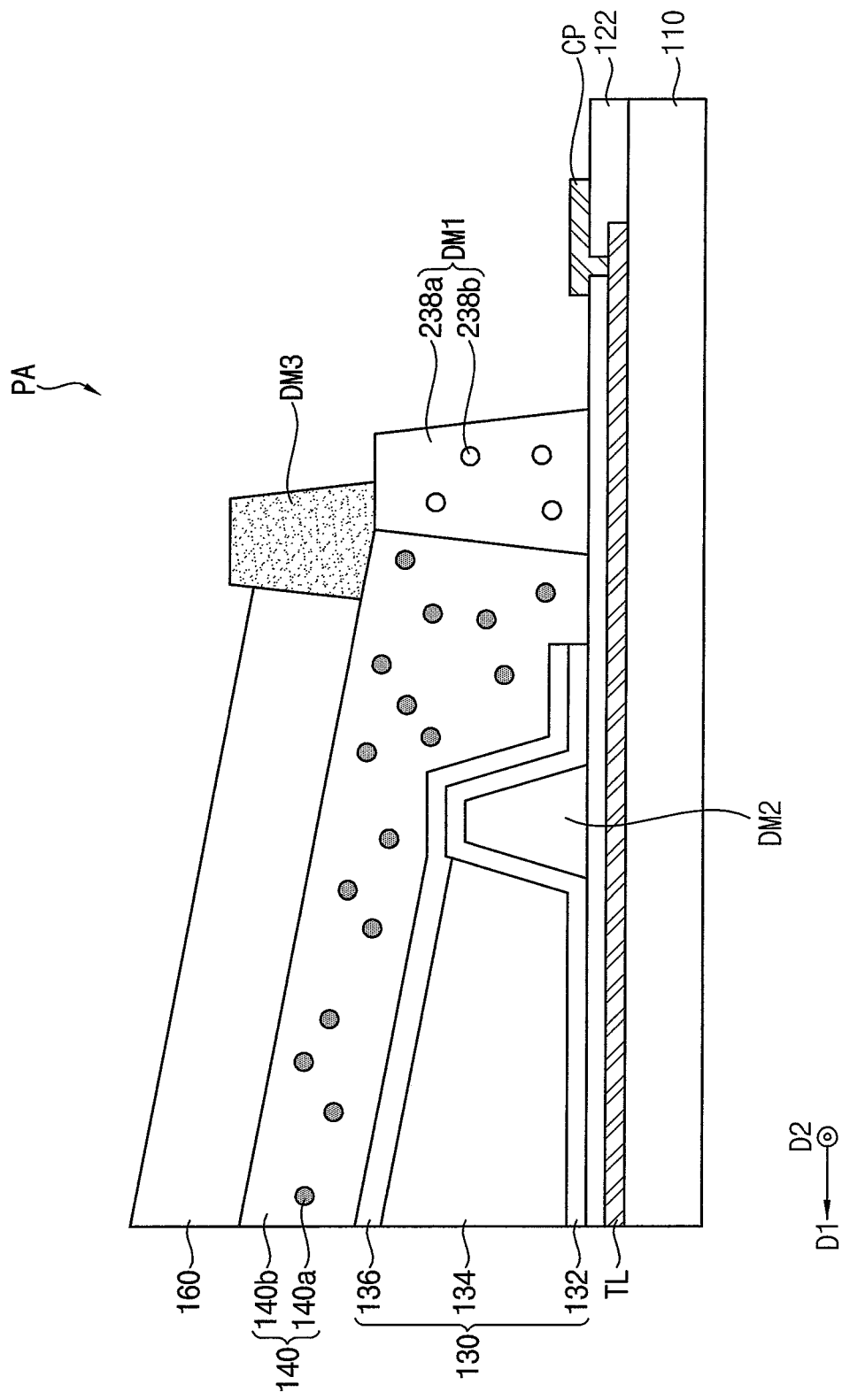
FIG. 16 is an enlarged cross-sectional view illustrating an exemplary embodiment of a peripheral area of a display device.

FIG. 15 is an enlarged cross-sectional view illustrating an exemplary embodiment of a pixel area PX of a display device 10. FIG. 16 is an enlarged cross-sectional view illustrating an exemplary embodiment of a peripheral area PA of a display device 10.

Referring to FIG. 15, a display device 10 includes a first color filter pattern 242 overlapping or corresponding to a first light-emitting area LA1, a second color filter pattern 244 overlapping or corresponding to a third light-emitting area LA3 and a third color filter pattern 246 overlapping or corresponding to a second light-emitting area LA2.

In an exemplary embodiment, for example, the first color filter pattern 242 may be a red filter, the second color filter pattern 244 may be a green filter, and the third color filter pattern 246 may be a blue filter.

As explained in the above, a display device 10 may further include a blue filter as desired.

Referring to FIG. 16, a capping layer 160 of a display device 10 may include an organic material. The display device 10 may further include a third dam structure DM3 to reduce or effectively prevent overflow of a capping layer material into an area where the connection pad CP is disposed.

In an exemplary embodiment, for example, a first dam structure DM1 may be provided or formed from a same material layer as a compensation pattern 236 disposed in a display area DA. The first dam structure DM1 may include a resin part 238a including an organic material and a scattering particle 238b which is dispersed in the resin part 238a.

The third dam structure DM3 may be provided or formed from a same material layer as a light-blocking member 150 disposed in the display area DA. The third dam structure DM3 may include a light-blocking material. That is, the third dam structure DM3 and the light-blocking member 150 may be respective portions or patterns of a same material layer on the base substrate 110. An exemplary embodiment of a method of manufacturing a display device 10 may include providing from a second single layer of material in the display area DA and extended to the peripheral area PA, the light-blocking member 150 and the third dam structure DM3 in the peripheral area PA and spaced apart from the display area DA.

The third dam structure DM3 may have a shape in a plan view, which surrounds the display area DA. In an exemplary embodiment, for example, the third dam structure DM3 may be disposed on and corresponding to the first dam structure DM1. The third dam structure DM3 may face the base substrate 110 with the first dam structure DM1 there between One or more of the exemplary embodiments may be used for various display device types such as an electroluminescent display device type, a micro light-emitting diode ("LED") display device type or the like.

One or more of the exemplary embodiments may be applied to various electronic devices which use a display device 10. One or more exemplary embodiment of the display device 10 may be applied to vehicle-display device, a ship-display device, an aircraft-display device, a portable communication device, electronic display devices for display or for information transfer, a medical-display device, etc.

The foregoing is illustrative of exemplary embodiments and is not to be construed as limiting thereof. Although exemplary embodiments have been described, those skilled in the art will readily appreciate that many modifications are possible in the exemplary embodiments without materially departing from the novel teachings and features of the invention. Accordingly, all such modifications are intended to be included within the scope of the invention. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the invention, as set forth in the following claims and equivalents thereof.

What is claimed is:

1. A display device comprising:
    a display area comprising a plurality of light-emitting areas from which lights having different colors are respectively emitted from the display device, the plurality of light-emitting areas including a first light-emitting area and a second light-emitting area;
    a peripheral area adjacent to the display area;
    a plurality of pixels which corresponds to the plurality of light-emitting areas and emits incident light;
    an encapsulation layer covering the plurality of pixels;
    a first color-converting pattern corresponding to the first light-emitting area and including a wavelength-converting particle which color-converts the incident light, the first color-converting pattern having a refractivity;
    a transmission pattern corresponding to the second light-emitting area and through which the incident light is transmitted;
    a low refractivity layer which is in the display area and faces the encapsulation layer with each of the first color-converting pattern and the transmission pattern therebetween, the low refractivity layer including:
        a first resin and a hollow particle which is in the first resin; and
        a refractivity defined by the first resin and the hollow particle, which is lower than the refractivity of the first color-converting pattern; and
    a first dam structure in the peripheral area and spaced apart from the display area, the first dam structure and the transmission pattern being portions of a same material layer.

2. The display device of claim 1, further comprising:
    a connection pad in the peripheral area and through which an electrical signal is provided to the display device from outside thereof; and
    a transfer wiring electrically connecting the connection pad to the plurality of pixels,
    wherein the first dam structure is between the connection pad and the display area.

3. The display device of claim 1, wherein the transmission pattern and the first dam structure each include a second resin and a scattering particle which is in the second resin.

4. The display device of claim 1, wherein the plurality of light-emitting areas further includes a third light-emitting area,
    further comprising a second color-converting pattern between the low refractivity layer and the encapsulation layer and corresponding to the third light-emitting area,
    wherein the second color-converting pattern includes a wavelength-converting particle.

5. The display device of claim 4, further comprising:
    a first color filter pattern corresponding to the first light-emitting area and facing the first color-converting pattern with the low refractivity layer therebetween; and
    a second color filter pattern corresponding to the third light-emitting area and facing the second color-converting pattern with the low refractivity layer therebetween.

6. The display device of claim 4, further comprising in the display area, a light-blocking member which faces the encapsulation layer with the low refractivity layer therebetween and is adjacent to each of the first light-emitting area, the second light-emitting area and the third light-emitting area.

7. The display device of claim 4, wherein the first light-emitting area emits a red light, the second light-emitting area emits a blue light, and the third light-emitting area emits a green light.

8. The display device of claim 1, further comprising a second dam structure in the peripheral area,
    wherein
    the second dam structure is between the first dam structure and the display area and is spaced apart from both the first dam structure and the display area,
    the encapsulation layer extends to the peripheral area from the display area to define an end of the encapsulation layer which is furthest from the display area, and
    the end of the encapsulation layer is between the first dam structure and the second dam structure.

9. The display device of claim 8, further comprising in the peripheral area, a third dam structure corresponding to the first dam structure and spaced apart from the display area, wherein the third dam structure includes a light-blocking material.

10. The display device of claim 1, wherein the wavelength-converting particle includes a quantum dot.

11. A display device comprising:
    a display area comprising a plurality of light-emitting areas from which lights having different colors are respectively emitted from the display device, the plurality of light-emitting areas including a first light-emitting area and a second light-emitting area;
    a peripheral area which is adjacent to the display area;
    a plurality of pixels which is in the display area and emits incident light;
    a partition wall layer defining a plurality of openings in the display area, the plurality of openings comprising a first opening;
    a color-converting pattern in the first opening of the partition wall layer and including a wavelength-converting particle, the color-converting pattern having a refractivity;
    an encapsulation layer covering the plurality of pixels;
    a low refractivity layer which is in the display area and faces the encapsulation layer with each of the color-converting pattern and the partition wall layer therebetween, the low refractivity layer including:
        a resin and a hollow particle which is in the resin; and
        a refractivity defined by the resin and the hollow particle, which is lower than the refractivity of the color-converting pattern; and
    a first dam structure in the peripheral area and spaced apart from the display area, the first dam structure and the partition wall layer being respective portions of a same material layer.

12. The display device of claim 11, wherein the partition wall layer and the first dam structure each include a light-blocking material.

13. The display device of claim 11, further comprising a color filter pattern facing the color-converting pattern with the low refractivity layer therebetween.

14. The display device of claim 11, wherein the plurality of openings in the display area further comprises a second opening spaced apart from the first opening, further comprising a transmission pattern in the second opening of the partition wall layer and through which the incident light is transmitted, wherein the transmission pattern is between the low refractivity layer and the encapsulation layer.

15. A method for manufacturing a display device, the method comprising:

providing in a display area of the display device:

a plurality of light-emitting areas from which lights having different colors are respectively emitted from the display device, the plurality of light-emitting areas including a first light-emitting area and a second light-emitting area; and a plurality of pixels which emits incident light and respectively corresponds to the plurality of light-emitting areas;

providing an encapsulation layer covering the plurality of pixels and extending into a peripheral area of the display device which is adjacent to the display area;

providing a color-converting pattern corresponding to the first light-emitting area and having a refractivity;

providing from a first single layer of material in the display area and extended to the peripheral area:

a transmission pattern corresponding to the second light-emitting area, and a first dam structure in the peripheral area and spaced apart from the display area; and providing a low refractivity layer facing the encapsulation layer with both the transmission pattern and the color-converting pattern therebetween, the low refractivity layer including:

a resin and a hollow particle which is in the resin; and a refractivity defined by the resin and the hollow particle, which is lower than the refractivity of the color-converting pattern.

16. The method of claim 15, further comprising:

providing a color filter pattern corresponding to the color-converting pattern and facing the color-converting pattern with the low refractivity layer therebetween; and providing a light-blocking member facing the encapsulation layer with both the low refractivity layer and the color-converting pattern therebetween, the light-blocking member adjacent to each of the first light-emitting area and the second light-emitting area.

17. The method of claim 16, further comprising providing a capping layer covering the color filter pattern and the light-blocking member.

18. The method of claim 17, wherein the capping layer includes an organic material.

19. The method of claim 18, further comprising providing from a second single layer of material in the display area and extended to the peripheral area:

the light-blocking member; and a second dam structure in the peripheral area and spaced apart from the display area.

20. The method of claim 19, wherein within the low refractivity layer:

the resin includes at least one of an acrylic resin, a siloxane resin, an urethane resin and an imide resin, and the hollow particle includes at least one of silica, magnesium fluoride and iron oxide.

* * * * *